(12) United States Patent
Matsueda

(10) Patent No.: US 10,854,696 B2
(45) Date of Patent: Dec. 1, 2020

(54) DISPLAY DEVICE INCLUDING FIRST WIRING AND SECOND WIRING HAVING DIFFERENT MELTING POINTS

(71) Applicant: NLT Technologies, Ltd., Kanagawa (JP)

(72) Inventor: Yojiro Matsueda, Kawasaki (JP)

(73) Assignee: TIANMA MICROELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/433,463

(22) Filed: Feb. 15, 2017

(65) Prior Publication Data

US 2017/0236886 A1  Aug. 17, 2017

(30) Foreign Application Priority Data

Feb. 16, 2016  (JP) .................................. 2016-027364

(51) Int. Cl.
*H01L 27/32* (2006.01)
*H01L 51/52* (2006.01)
*H01L 27/12* (2006.01)

(52) U.S. Cl.
CPC ...... *H01L 27/3262* (2013.01); *H01L 27/3258* (2013.01); *H01L 27/3279* (2013.01); *H01L 51/5246* (2013.01); H01L 27/1214 (2013.01); H01L 2227/323 (2013.01)

(58) Field of Classification Search
CPC ............. H01L 27/3262; H01L 27/3258; H01L 27/3279; H01L 51/5246
See application file for complete search history.

(56) References Cited

U.S. PATENT DOCUMENTS

| 2002/0126243 A1 | 9/2002 | Hibino et al. |
| 2003/0137325 A1* | 7/2003 | Yamazaki ............. H01L 27/322 327/80 |
| 2007/0170849 A1 | 7/2007 | Park |
| 2007/0170854 A1 | 7/2007 | Kwak |
| 2007/0176550 A1 | 8/2007 | Kwan |
| 2013/0048995 A1 | 2/2013 | Yamazaki et al. |

(Continued)

FOREIGN PATENT DOCUMENTS

| JP | 2000-241832 A | 9/2000 |
| JP | 2007-200835 A | 8/2007 |
| JP | 2007-200849 A | 8/2007 |

(Continued)

*Primary Examiner* — Matthew E. Gordon
(74) *Attorney, Agent, or Firm* — Sughrue Mion, PLLC

(57) ABSTRACT

The object is providing an organic light emitting display device achieving a narrow bezel. A display device 10 has a first substrate 11, a second substrate 12, a sealant 25 sealing between the substrates, a display unit 15 including pixel circuits, a driving circuit 20 including a transistor for driving the pixel circuits, a first wiring unit for supplying voltage to the transistor, and a second wiring unit connecting between the transistor and the first wiring unit. The driving circuit 20 is disposed outside the display unit 15, the first wiring unit is disposed between the display unit 15 and the driving circuit 20, the display unit 15 and the first wiring unit are disposed between the first substrate 12 and the second substrate 12, the melting point of a second metal constituting the second wiring unit is higher than that of a first metal constituting the first wiring unit.

14 Claims, 36 Drawing Sheets

(56) References Cited

U.S. PATENT DOCUMENTS

2013/0049062 A1* 2/2013 Hatano ................... H01L 21/50
257/99
2013/0300284 A1 11/2013 Nishido

FOREIGN PATENT DOCUMENTS

| | | | |
|---|---|---|---|
| JP | 2007-200884 A | 8/2007 | |
| JP | 2010-244766 A | 10/2010 | |
| JP | 2013-065549 A | 4/2013 | |
| JP | 2013-254732 A | 12/2013 | |

* cited by examiner

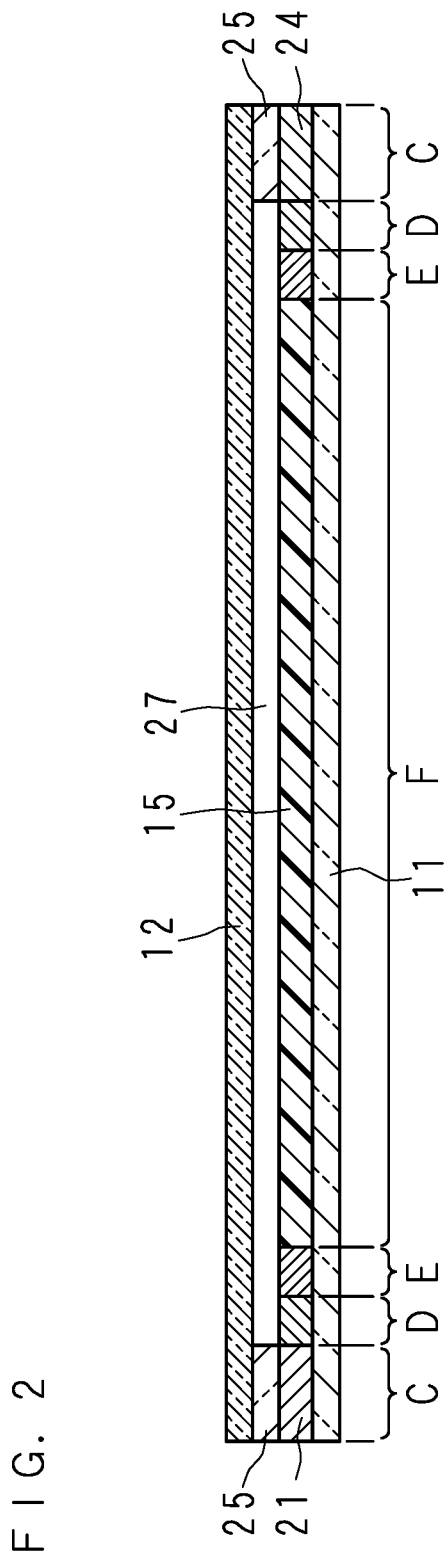

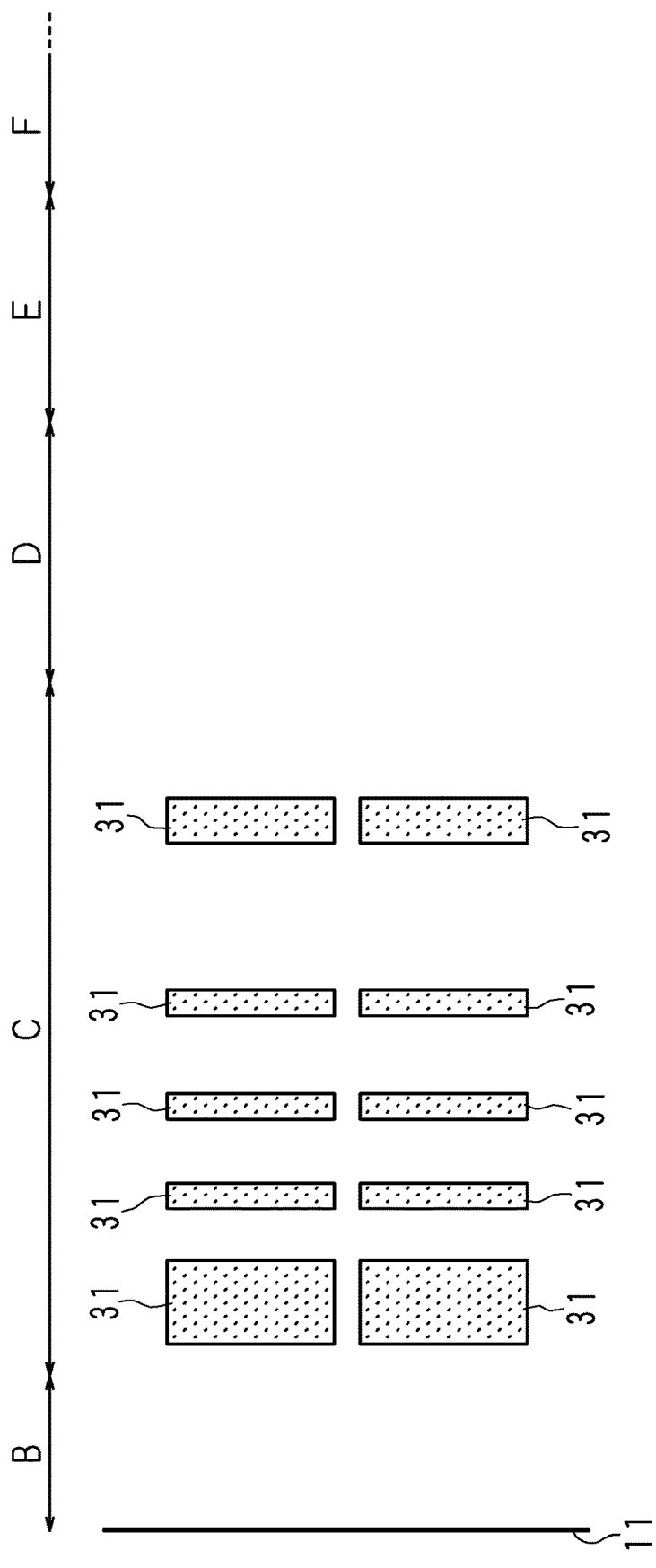

F I G. 1 3
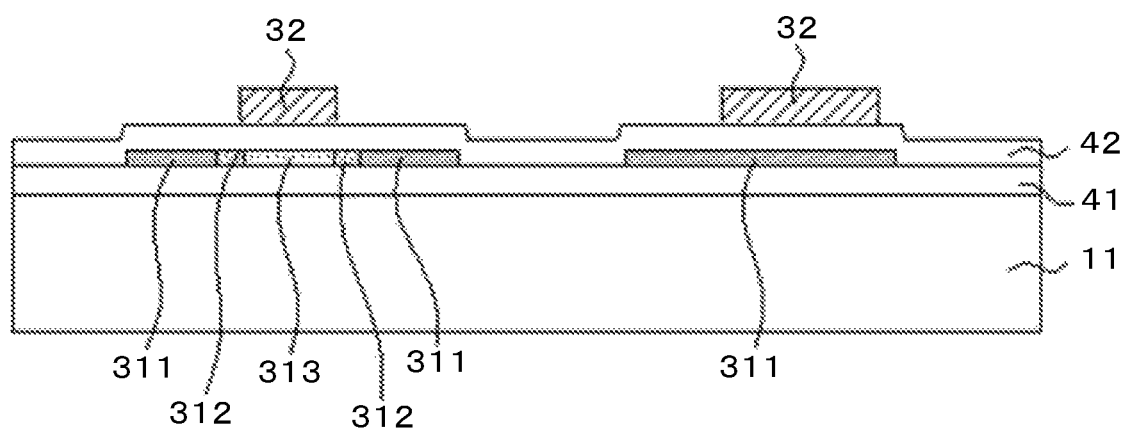
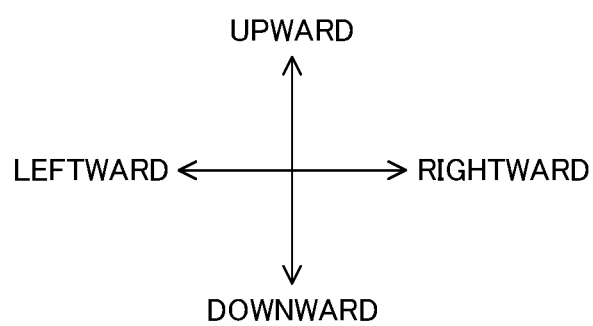

F I G. 1 5
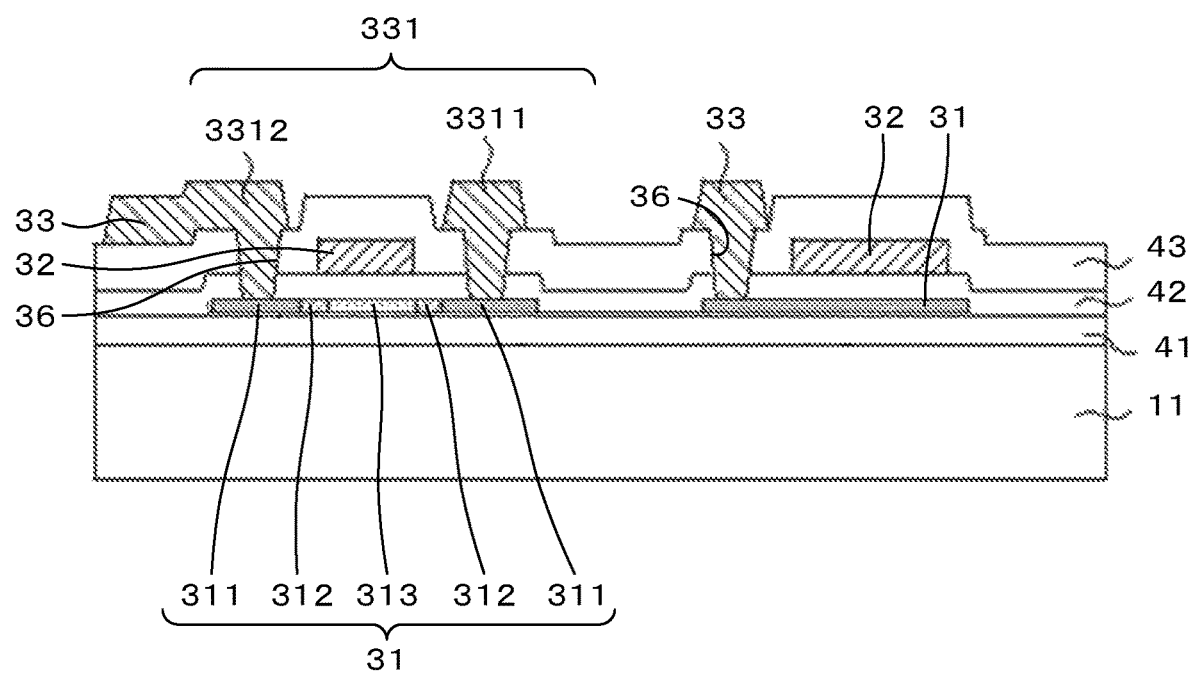

F I G. 2 4
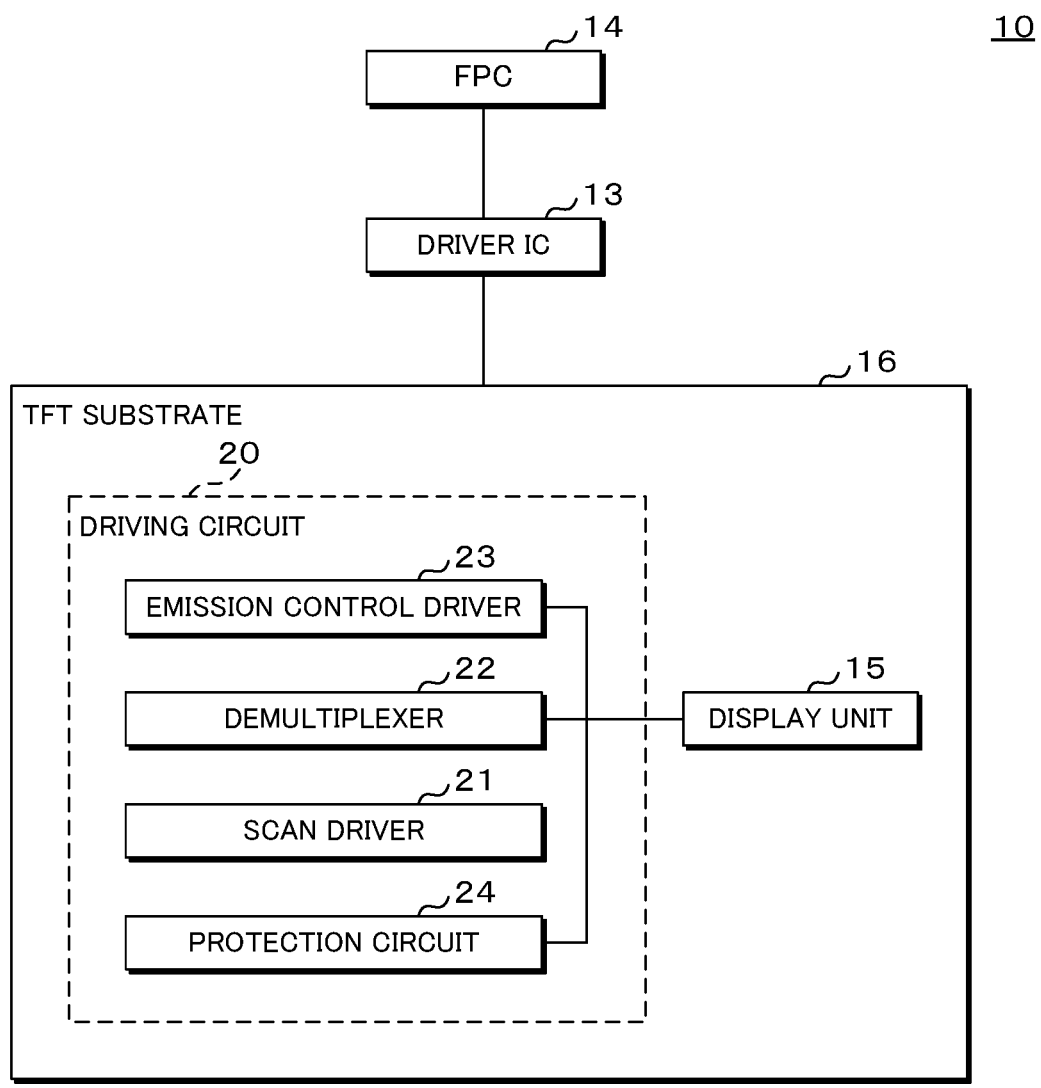

DISPLAY DEVICE INCLUDING FIRST WIRING AND SECOND WIRING HAVING DIFFERENT MELTING POINTS

This non-provisional application claims priorities under 35 U.S.C. § 119(a) on Patent Application No. 2016-027364 filed in Japan on Feb. 16, 2016, the entire contents of which are hereby incorporated by reference.

FIELD

The present disclosure relates to a display device and a method for manufacturing a display device.

BACKGROUND

Display devices for displaying images utilizing OLED (Organic Light Emitting Diode) have been proposed. An OLED display device is simply referred to as a display device.

An OLED includes an organic thin film that is more likely to be damaged due to moisture and oxygen. Thus, such a display device has a structure in which a glass substrate having a display unit where a number of OLEDs and pixel circuits are aligned on its surface is covered by a sealing glass in the same size as the glass substrate such that the substrate and the sealing glass are hermetically bonded with each other at the periphery thereof.

The space between the glass substrate and the sealing glass is filled with dry air or nitrogen gas. This configuration prevents the OLEDs from being degraded.

The configuration described above is disclosed in Japanese Patent Application Laid-Open No. 2010-244766 (hereinafter referred to as Patent Document 1), Japanese Patent Application Laid-Open No. 2007-200849 (hereinafter referred to as Patent Document 2), Japanese Patent Application Laid-Open No. 2013-065549 (hereinafter referred to as Patent Document 3) and Japanese Patent Application Laid-Open No. 2013-254732 (hereinafter referred to as Patent Document 4).

Low-melting-point powdered glass is used for bonding the glass substrate and the sealing glass. The following description provides a brief overview of the bonding method. A paste containing powdered glass is applied to a part of the glass substrate where the sealing glass is to be bonded. The sealing glass is superposed on the glass substrate. By irradiating the paste through the sealing glass with a laser beam, the paste containing the powdered glass is melted. The melted glass is thus hardened to thereby form a bonded portion where the glass substrate and the sealing glass are hermetically bonded.

Meanwhile, there is a need to provide outside the display unit a driving circuit for driving the pixel circuits to control the luminance of the light of the OLEDs. The bonded portion is provided so as to surround the driving circuit and the display unit. The bonded portion and the driving circuit are placed at a region where no image is displayed and that surrounds the display unit. Hereinafter, the region where no image is displayed and that surrounds the display unit is called a bezel region.

Technical means for narrowing the bezel region have been proposed (see Patent Documents 1, 2). Hereafter, a narrowed bezel region is called a narrow bezel.

SUMMARY

The display device according to one aspect of an embodiment includes a first substrate, a second substrate, a sealant that seals the first substrate and the second substrate, a display unit with a plurality of pixels each including an organic light emitting element that emits light based on current and a pixel circuit that controls current to be supplied to the organic light emitting element, a driving circuit that has a transistor for driving the plurality of pixel circuits, a first wiring unit that supplies voltage to the transistor, and a second wiring unit that connects an electrode portion included in the transistor and the first wiring unit. The driving circuit is disposed outside the display unit, the first wiring unit is disposed between the display unit and the driving circuit, the display unit and the first wiring unit are disposed between the first substrate and the second substrate, a melting point of a second metal constituting the electrode portion and the second wiring unit is higher than that of a first metal constituting the first wiring unit, and the first substrate, the driving circuit, the sealant, and the second substrate are layered.

It is to be understood that both the foregoing general description and the following detailed description are exemplary and explanatory and are not restrictive of this disclosure.

BRIEF DESCRIPTION OF THE DRAWINGS

FIG. 2 is a schematic cross-sectional view of the display device 10 taken along the line II-II in FIG. 1.

FIG. 12 illustrates a manufacturing process of the OLED panel.

FIG. 13 illustrates a manufacturing process of the OLED panel.

FIG. 15 illustrates a manufacturing process of the OLED panel.

FIG. 24 is a configurational view of hardware of the display device.

DETAILED DESCRIPTION

Hereinafter, embodiments of the display device will be described with reference to the accompanying drawings. It is noted that the ordinal numbers such as "the first", "the second" or the like applied to components in the specification and the claims are for clarifying the relationship among the components and avoiding confusion among the components. Therefore, these ordinal numbers do not limit the components to the number.

Furthermore, the dimensions and the ratios of the illustrated components may not be illustrated so as to coincide with those of the actual components. Also, for the convenience of illustrations and descriptions of the drawings, some components actually included may be omitted, or the dimensions of the illustrated components may be presented more exaggeratedly than those of the actual components.

In addition, the term "connection" means that there is an electrical connection between the objects to be connected. The phrase "electrical connection" also includes a case that the objects to be connected are connected via electrical elements such as electrodes, wirings, resistors, and capacitors. It is noted that the terms "electrode" and "wiring" do not limit these components to the exact function. For example, the "wiring" may be utilized as a part of the "electrode." In contrast, the "electrode" can be utilized as a part of the "wiring."

Embodiment 1

Figure 1:
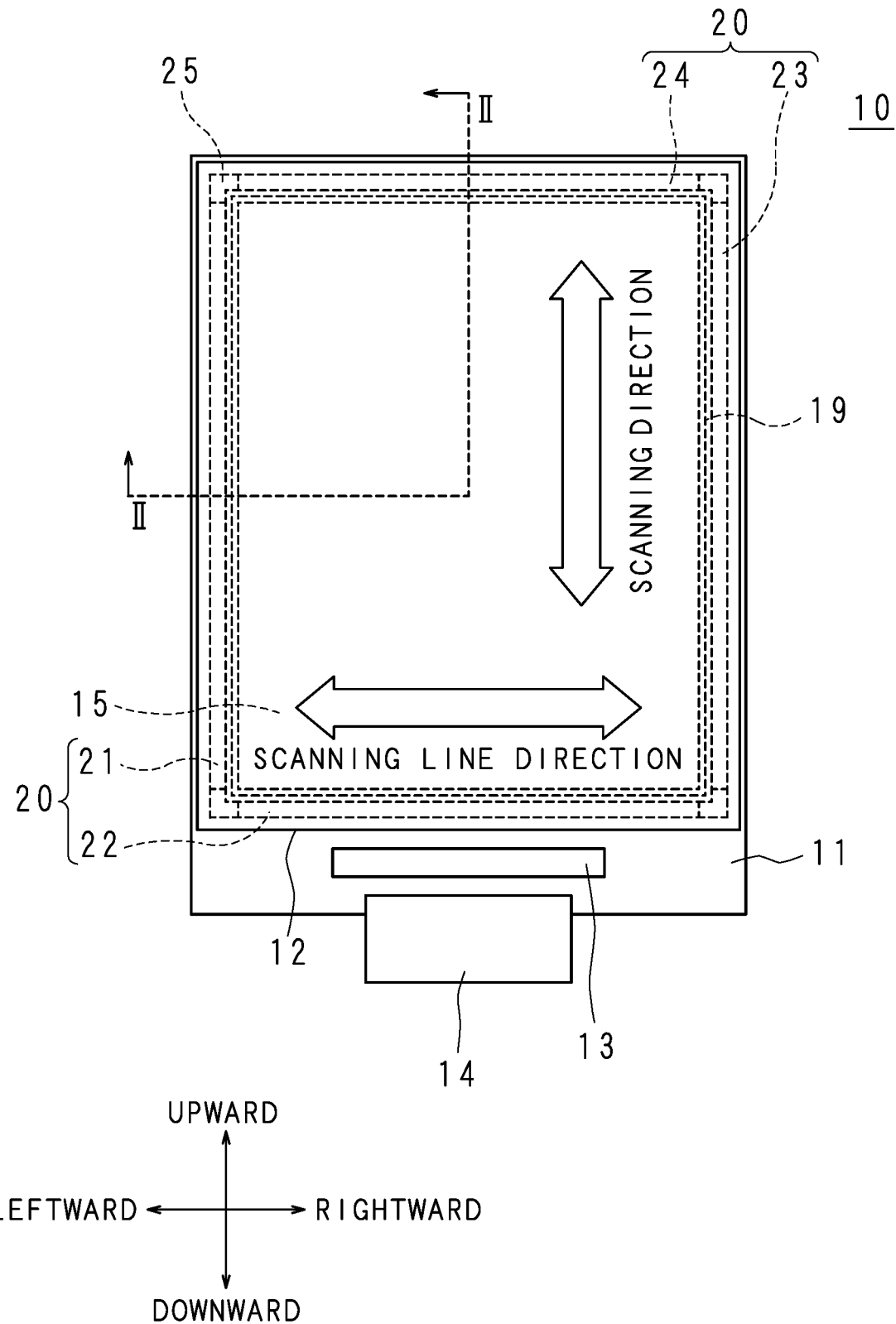
FIG. 1 is an external view of a display device.

FIG. 1 is an external view of a display device 10. FIG. 1 is a drawing when the display device 10 is viewed from a front side, that is, from a side of an image displaying surface. The display device 10 is a device for displaying still images and moving images. The display device 10 is installed onto electronic equipment. The electronic equipment include smartphones, cellular phones, tablet-type devices, personal computers, and television sets, for example. The following description employs right, left, upward and downward directions indicated by arrows in the respective drawings. The display device 10 according to the present embodiment is an OLED panel.

The display device 10 is provided with a first substrate 11, a second substrate 12, a driver IC 13 and flexible printed circuits (FPCs) 14. The first substrate 11 and the second substrate 12 are substrates made of glass. The first substrate 11 and second substrate 12 are vertically elongated rectangles. The horizontal length of the second substrate 12 is substantially equal to that of the first substrate 11. The vertical length of the second substrate 12 is shorter than that of the first substrate 11. The first substrate 11 and the second substrate 12 are superposed with the second substrate 12 facing the front such that the upper sides, the left sides and the right sides are kept aligned. The lower part of the top surface of the first substrate 11 is not covered with the second substrate 12. The driver IC 13 is an integrated circuit which is mounted on the first substrate 11 via an anisotropically conductive film. The function of the driver IC 13 will be discussed later.

The FPC 14 is a flexible substrate connected to the first substrate 11. The first substrate 11 includes wirings (not illustrated) that connect between the FPC 14 and the driver IC 13 as well as a driving circuit 20 that will be described later. The FPC 14 is provided with a connector (not illustrated) that is to be connected to the controller of the electronic equipment. The display device 10 obtains an image signal from the controller of the electronic equipment through the FPC 14.

The first substrate 11 is provided with a display unit 15 where a number of pixels (not illustrated) are regularly aligned. The display unit 15 includes a cathode electrode 19. The second substrate 12 covers the cathode electrode 19.

Each pixel includes an OLED (see FIG. 26) and a pixel circuit (see FIG. 26) for controlling current to be supplied to the OLED (Organic light emitting element). The OLED 97 emits light based on the current supplied by the pixel circuit. The pixel circuit will be discussed later.

The cathode electrode 19 is a common electrode disposed on the OLEDs connected to the respective pixels. A metal thin film having a small work function, which is made of Li, Ca, LiF/Ca, LiF/Al, Al, Mg, Ag, MgAg and compounds thereof, can be used for the cathode electrode 19. In order to decrease the resistance of the cathode electrode 19, transparent conductive film materials such as indium tin oxide (ITO), indium zinc oxide (IZO), ZnO, $In_2O_3$ or the like, or a translucent electrode made of transparent conductive ink, graphene or the like may be deposited on these metal thin films entirely or partially as auxiliary wirings.

The first substrate is provided with the driving circuit 20. The driving circuit 20 according to this embodiment is at least one example including a scan driver 21, a demultiplexer 22, an emission control driver 23, and a protection circuit 24. The driving circuit 20 is the scan driver 21, for example. The driving circuit 20 is formed by semiconductor processes. The following provides a brief overview of the semiconductor circuit.

The scan driver 21 is disposed outside the display unit 15 along the left side thereof. The scan driver 21 is a circuit for selecting and driving a scanning line of the display unit 15 based on an image signal obtained through the FPC 14. The scanning line is a row of pixels that are aligned in a scanning line direction illustrated by the horizontal boldface arrow in FIG. 1 and simultaneously change in luminance.

The vertical boldface arrow illustrated in FIG. 1 indicates a scanning direction. The scan driver 21 switches a scanning line to be driven in a scanning direction to thereby display an image on the display unit 15. It is noted that the order of switching the scanning lines by the scan driver 21 may be from the top to the bottom or from the bottom to the top of the display unit 15. The scan driver 21 may switch the scanning lines in an arbitrary order.

The demultiplexer 22 is disposed outside the display unit 15 along the bottom side thereof. The demultiplexer 22 is a circuit for demultiplexing a data row of a high transfer rate obtained through the FPC 14 back into a plurality of data rows of an original transfer rate. The demultiplexer 22 outputs a signal of a single scanning line to the display unit 15 at a time.

The emission control driver 23 is disposed outside the display unit 15 along the right side thereof. The emission control driver 23 is a circuit for controlling a light-emitting time of each of the OLEDs 97 in the display unit 15 on the basis of an image signal obtained through the FPC 14.

It is noted that the scan driver 21 and the emission control driver 23 may be reversely disposed. The scan driver 21 may be disposed on both sides of the display unit 15 to thereby simultaneously drive the scanning lines from both sides. This makes it possible to avoid delays in operations between the pixels aligned in the scanning line direction.

The protection circuit 24 is disposed outside the display unit 15 along the top side thereof. The protection circuit 24 is a circuit for preventing damage to a display panel due to electrostatic discharge or the like.

Each of the scan driver 21, the demultiplexer 22, the emission control driver 23 and the protection circuit 24 is an integrated circuit including a plurality of transistors, and is one example of the driving circuit 20. Hereinafter, any one of the scan driver 21, the demultiplexer 22, the emission control driver 23 and the protection circuit 24 or the combination thereof may be referred to as the driving circuit 20.

Figure 3:
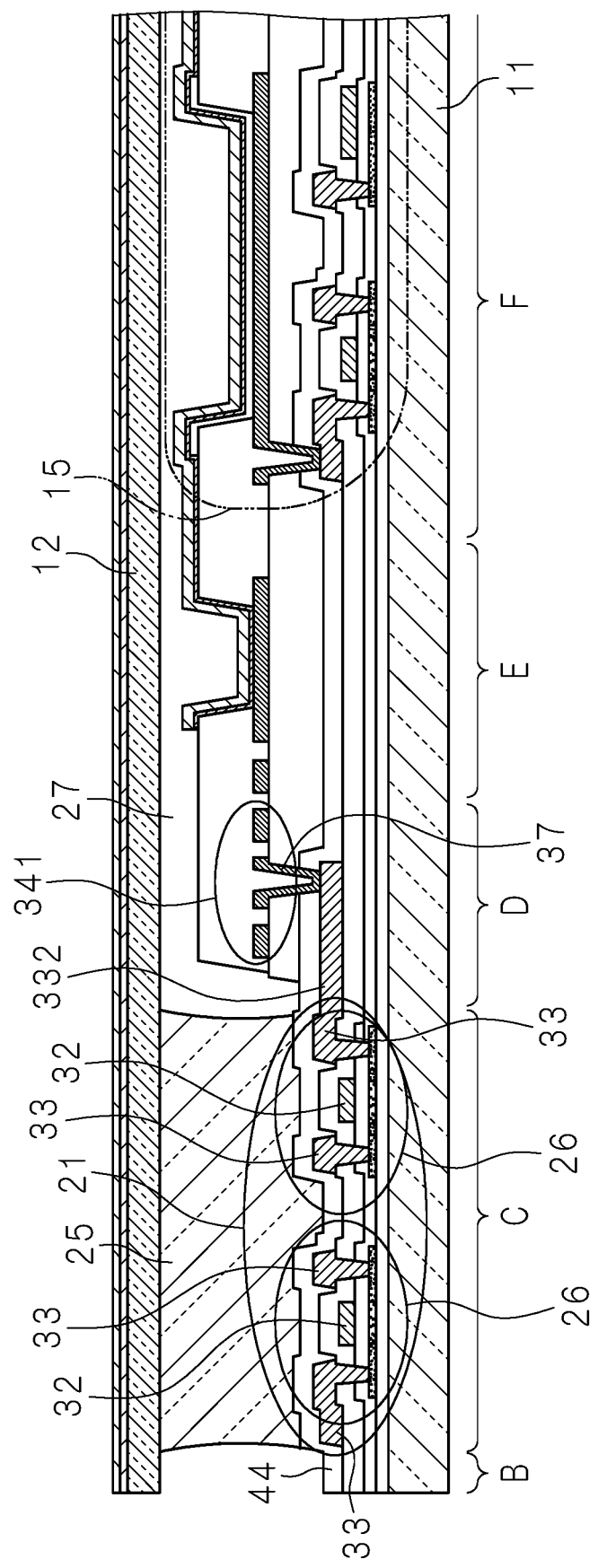
FIG. 3 is a schematic enlarged cross-sectional view illustrating a left part of FIG. 2 in an enlarged scale.

FIG. 2 is a schematic cross-sectional view of the display device 10 taken along the line II-II in FIG. 1. FIG. 3 is a schematic enlarged cross-sectional view illustrating a left part of FIG. 2 in an enlarged scale. With reference to FIG. 2 and FIG. 3, the cross-sectional structure of the display device 10 will be discussed.

The cross-sectional structure of the display device 10 is divided into a margin region B (see FIG. 3), a seal region C, a first power supply region D, a second power supply region E, and a display region F from the outside in this order. It is noted that the margin region B is omitted in FIG. 2 and illustrated in FIG. 3 since it is narrow.

The margin region B is a cut margin for the case that the first substrate 11 and the second substrate 12 are separated. If there is a small margin, when the display panel is cut separately, a physical stress is applied to the sealant 25 which causes a crack, from which moisture may enter. This makes the OLEDs less reliable. Furthermore, when the sealant 25 extends to the cut part, cutting itself is difficult, which degrades in an accuracy of the cutting work and causes sever irregularities on the cut surface.

The seal region C is a region for sealing the space between the first substrate 11 and the second substrate 12. The OLEDs deteriorate their characteristics due to entering of moisture. For this reason, the space 27 hermetically sealed by the sealant 25 is filled with inert gas such as dry air, or nitrogen gas. Also, the presence of the organic film layer at the seal region allows moisture to enter through the layer and the interface. In order to prevent such moisture from entering, the bottom of the sealant 25 is formed by an inorganic film alone. The organic film used during the manufacturing process is removed at the seal region C.

The driving circuit 20 (scan driver 21, for example) is disposed within the seal region C. The driving circuit 20 includes transistors 26. Although two transistors 26 are schematically presented in FIG. 3 for convenience of illustration, three or more transistors 26 are actually provided in the seal region C. The transistor 26 includes inorganic materials, a gate portion 32 and a source-drain portion 33.

A first wiring unit 341 for supplying power and a clock to the driving circuit 20 is provided in the first power supply region D. The first wiring unit 341 comprises parallel lines extending in the direction of the thickness of the sheet of FIG. 3, that is, the vertical direction of the display device 10 (see FIG. 1). It is noted that although three wirings of the first wiring units 341 are schematically illustrated in FIG. 3 for convenience of illustration, the display device 10 according to this embodiment is provided with four wirings of the first wiring units 341 as will be described later.

The first wiring unit 341 is made of a low-melting-point metal. The first wiring unit 341 is connected to the source-drain portion 33 made of metals via a second contact hole 37. The detail of the first power supply region D will be discussed later.

Wirings for supplying power to the display unit 15 including the cathode electrode 19 are disposed in the second power supply region E. In the organic light emitting display manufacturing process, the cathode electrode 19 is formed so as to cover the area ranging from the display region F described later to the second power supply region E, and is connected to the wirings for supplying power to the display unit 15 in the second power supply region E.

The display unit 15 is disposed in the display region F. The detail of the second power supply region E and the display region F will be discussed later.

With reference to FIG. 1 to FIG. 3, a structure of bonding the first substrate 11 and the second substrate 12 will be described.

As illustrated in FIG. 1, the second substrate 12 covers the display unit 15, the cathode electrode 19, the scan driver 21, the demultiplexer 22, the emission control driver 23 and the protection circuit 24 that are on the first substrate 11.

The first substrate 11 and the second substrate 12 are facing to each other. There is a space 27 between the first substrate 11 and the second substrate 12. The space 27 is filled with inert gas such as dry air or nitrogen gas.

The sealant 25 applied so as to surround the display unit 15 as illustrated in FIG. 1 bonds the first substrate 11 and the second substrate 12, and hermetically seals the space 27 between the first substrate 11 and the second substrate 12 as illustrated in FIG. 2 and FIG. 3.

The sealant 25 is made of material that is melted by heating and hardened by cooling, for example. The sealant 25 is made of glass frit bonding material, for example. A manufacturing apparatus (not illustrated) of the display device 10 irradiates low-melting-point powdered glass disposed between an inorganic insulator film 44 and the second substrate 12 with a laser beam through the second substrate 12. By the irradiation of the laser beam, the low-melting-point powdered glass is heated and melted (see a laser beam irradiated region L in FIG. 4 in regard to the region irradiated by a laser beam).

The melted low-melting-point powdered glass is then hardened. The hardened low-melting-point powdered glass (sealant 25) allows the driving circuit 20 (scan driver 21, for example) formed on the surface of the first substrate 11 and the second substrate 12 to be bonded. As described above, the sealant 25 is made of material that is melted by heating and hardened by cooling. Also, the display device 10 has the inorganic insulator film 44 between the sealant 25 and driving circuit 20.

The display unit 15 has a plurality of pixels each including an OLED (see FIG. 26) that emits light based on current and a pixel circuit (see FIG. 26) that controls the current to be supplied to the OLED. The driving circuit 20 (scan driver 21, for example) has transistors 26 for driving the plurality of pixel circuits. The first wiring unit 341 supplies voltage to the transistors 26.

The driving circuit 20 (scan driver 21, for example) is disposed at the exterior of (disposed outside) the display unit 15. The first wiring unit 341 is disposed between the display unit 15 and the driving circuit 20 on the side of the first substrate 11.

A second wiring unit 332 connects between the electrode portion (source-drain portion 33, for example) included in the transistor 26 and the first wiring unit 341. It is noted that the source-drain portion 33 means any one or both of the source electrode and the drain electrode of the transistor. Also, the source-drain portion 33 may mean any one or both of a source wiring connected to the source electrode and a drain wiring connected to a drain electrode.

As described above, the display device 10 includes the first substrate 11, the second substrate 12, the sealant 25, the display unit 15, the driving circuit 20, the first wiring unit 341, and the second wiring unit 332. The sealant 25 seals the first substrate 11 and the second substrate 12. It is noted that by disposing the sealant 25 over the scan driver 21, sealing is made between the first substrate 11 and the second substrate 12 in FIG. 3. In other words, the sealant 25 seals the space 27 between the first substrate 11 and the second substrate 12. The display unit 15, the driving circuit 20, the first wiring unit 341, and the second wiring unit 332 are disposed on the first substrate and are disposed under the second substrate.

Figure 4:
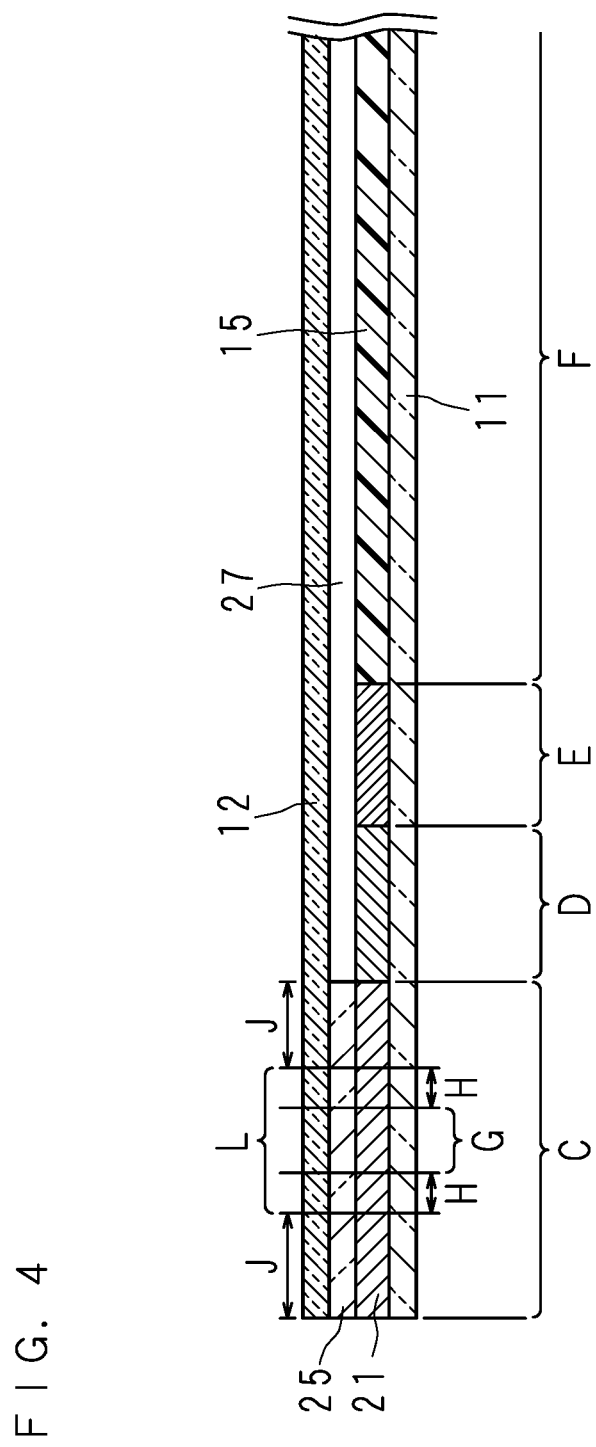
FIG. 4 illustrates a manufacturing process of an OLED panel.

The following description provides one example of the sealant 25 and a method of sealing the space 27 between the first substrate 11 and the second substrate 12. FIG. 4 illustrates a manufacturing process of an OLED panel. FIG. 4 is a schematic enlarged cross-sectional view illustrating a left part of FIG. 2 in an enlarged scale. In FIG. 4, the layers interposed between the first substrate 11 and the second substrate 12 are not illustrated. It is noted that FIG. 4 is a drawing illustrating a sealing process, that is, the last step of the manufacturing process of the OLED panel. The overall flow of the manufacturing process will be described later.

As illustrated in FIG. 4, the seal region C includes a printed region G, an alignment margin H, a diffusion margin J and the laser irradiated region L. The transistors 26 illustrated in FIG. 3 are disposed directly below the region L irradiated by a laser. It is noted that the diffusion margin J may include a part of the transistor 26.

The following description provides a brief overview of the sealing process. The manufacturing apparatus applies the sealant 25 to the peripheral edge of one surface of the first substrate 11 on which the display unit 15 (see FIG. 1) and the driving circuit 20 (see FIG. 1) are formed so as to surround the display unit 15. The manufacturing apparatus also applies the sealant 25 over the driving circuit 20 (scan driver 21, for example). Here, the application is made by printing, for example. The region onto which the sealant 25 is to be printed is indicated by the printed region G. The sealant 25 to be printed is a paste predominantly composed of low-melting-point powdered glass, that is, glass frit, for example.

The manufacturing apparatus covers the sealant 25 by disposing the second substrate 12 over the first substrate 11. The manufacturing apparatus melts the sealant 25 by the irradiation of a laser beam through the second substrate 12. The laser irradiated region L is a region to be irradiated by a laser beam. The laser irradiated region L is larger than the printed region G by twice the alignment margin H.

The melted sealant 25 spreads between the driving circuit 20 (scan driver 21, for example) and the second substrate 12. This requires the need to ensure the diffusion margins J on both sides of the laser irradiated region L. The melted sealant 25 is hardened to seal the space 27 between a TFT substrate 16 and the second substrate 12, that is, the space 27 between the first substrate 11 and the second substrate 12.

As illustrated in FIG. 1 and FIG. 3, the sealant 25 is disposed between the transistors 26 of the driving circuit 20 and the second substrate 12. In the laser irradiated region L, the transistors 26 of the driving circuit 20 are disposed. When the transistors 26 of the driving circuit 20 are irradiated by a laser beam, the temperature of the transistors 26 increases due to the irradiation of the laser beam or the sealant 25 melted by the laser irradiation. Accordingly, a first region of the driving circuit 20 is disposed outside a second region of the display unit 15, and a third region of the first wiring unit 341 is disposed between the first region and the second region.

As described above, the metal constituting the gate portion 32 and the metal constituting the source-drain portion 33 of the transistor 26 are refractory metal materials. The inorganic materials constituting the transistor 26 are also heat resistant. Accordingly, the transistor 26 has resistance to damage caused by the heat by the irradiation of a laser beam. Thus, changes in the characteristics of the transistor 26 can be minimized even if the transistor 26 is irradiated with a laser beam during manufacturing.

The sealant 25 melted by the irradiation of a laser beam is hardened by cooling. The hardened part of the sealant 25 and the driving circuit 20 overlap. Furthermore, the inorganic insulator film 44 and the hardened part of the sealant 25 overlap. In other words, the hardened part of the sealant 25 and the transistors 26 of the driving circuit 20 are opposed to (face) each other. More specifically, the laser irradiated region L and the transistors 26 of the driving circuit 20 overlap (are opposed to each other).

Meanwhile, display devices having a sealing structure by the glass frit bonding materials have been conventionally used. However, in the conventional display devices, a driving circuit including transistors is disposed at a position displaced from the position directly below the sealing portion using the glass frit (see Patent Document 1-4).

However, the inventors of the present application dispose the driving circuit 20 directly below the sealant 25 and below the region L irradiated by a laser beam during manufacturing in order to achieve a narrow bezel. More specifically, the inventors of the present application design the transistors 26 of the driving circuit 20 such that they are disposed directly below the laser irradiated region L. It is noted that in Patent Document 2, a scan driving unit is disposed directly below the part applied with glass frit paste.

However, in Patent Document 2, before a sealing process, masking is made on a part of the scan driving unit or the like that suffers from heat. Thus, a part above the scan driving unit is not irradiated by a laser beam that melts glass frit. The masking prevents the wirings and the transistors within the scan driving unit from being deformed due to heat.

From the above, in Patent Document 2, the scan driving unit is not disposed at a region irradiated by a laser beam that melts glass frit. Thus, the glass frit applied over the scan driving unit is not melted and does not contribute to the sealing structure. That is, in Patent Document 2, there is a need to provide a region where glass frit is irradiated and melted by a laser beam except for the region directly above the scan driving unit in order to achieve the sealing structure. Accordingly, it is difficult to have an enough effect of a narrow bezel.

According to this embodiment, the driving circuit 20 is also disposed directly below the laser irradiated region L irradiated by a laser beam. Such a layout makes it possible to offer the display device 10 with a narrow bezel.

In such a layout, when a laser beam is emitted to the source electrode, the drain electrode and the gate electrode of the transistor in the driving circuit 20 and the wirings connecting therebetween, these electrodes and wirings may be melted.

Thereupon, in this embodiment, a refractory metal such as molybdenum or titanium is used for materials of such electrodes and wirings of the transistors in order to avoid melting by the irradiation with the laser beam. The configuration in which the transistors composed of a refractory metal is disposed directly below the sealant 25 in order to achieve a narrow bezel is neither described nor suggested in the prior arts.

Furthermore, the first wiring unit 341 for supplying voltage to the transistors is disposed between the display unit 15 and the region of the driving circuit 20 to thereby optimize the layout of the wirings.

Disclosed is a technique of providing wiring units on both sides of the area where the driving circuit is positioned. One example is a configuration in which comb-shaped wiring units are opposed to each other. In this case, the wiring units are positioned directly below the sealing portion using glass frit (see Patent Document 1). Such a positional relationship may require the wiring units directly below the frit to be composed of a refractory metal (see Patent Document 1).

In the case that a refractory metal is used for the wiring materials, resistance increases, which may cause a voltage drop. This generates power supply delay and signal delay. In the case that power supply delay, signal delay or the like occurs, this may produce an adverse effect such as unstable operations of the pixels in the display region and deterioration in image quality. Especially, such wirings (first wiring unit 341, for example) supply power from the power source device to the driving circuit. Furthermore, such wirings supply a clock from a clock generation circuit to the driving circuit. In addition, there is a relatively long distance between the power supply device or the clock generation circuit and the driving circuit, making the length of the wiring units long. Therefore, when the refractory metal having high resistance is used for the materials of the wiring unit, an adverse effect caused by power supply delay, signal delay or the like is highly likely to occur. Thus, the operations of the pixels are liable to be unstable. In order to avoid such an adverse effect caused by the delays, the layout is optimized as described above to thereby eliminate the need for the first wiring unit 341 being made of a refractory metal in this embodiment. Then, by using a low-melting-point metal having low sheet resistance for the first wiring unit 341, the occurrence of the delays described above is prevented.

The refractory metals (molybdenum, titanium or the like) to be used for the electrodes and wirings of the transistors 26 of the driving circuit 20 according to this embodiment has higher resistances than aluminum or the like. This may cause a voltage drop, resulting in power-supply delay and signal delay.

Figure 26:
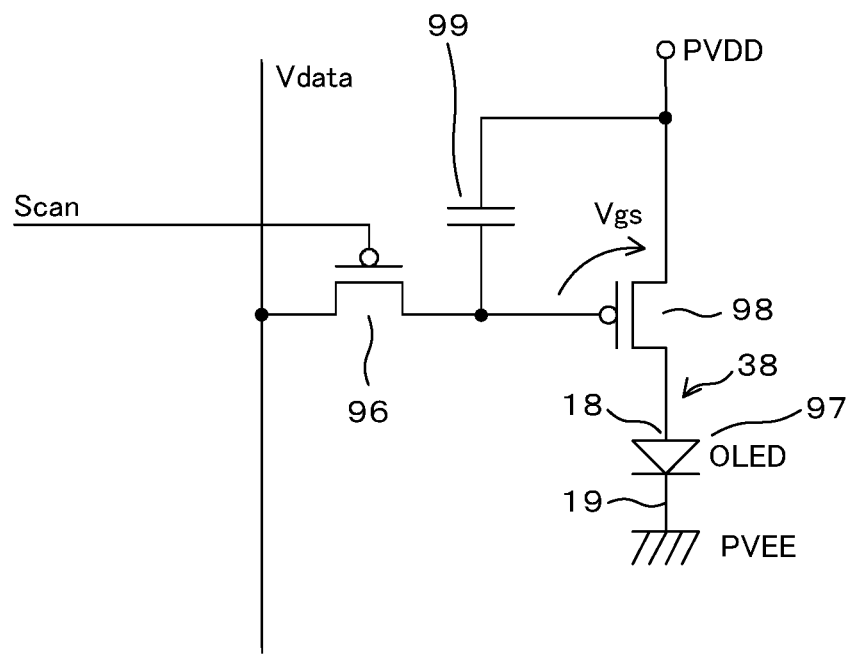
FIG. 26 is a circuit diagram illustrating a circuit for making a single OLED emit light.

In order to avoid the adverse effect by such delays, in this embodiment, the first wiring unit 341 is made of the same material as that of the anode electrode 18 (see FIG. 5) of the OLED (see FIG. 26). The anode electrode 18 (see FIG. 5) is made of a low-melting-point metal.

It is noted that by using for the materials of the first wiring unit 341 the low-melting-point metal the same as that of the anode electrode 18, the first wiring unit 341 can be formed at the same timing when the anode electrode 18 is formed. This makes it possible to provide the display device 10 with a narrow bezel with a simple manufacturing process.

Meanwhile, the length of the second wiring unit 332 connecting the electrode portion (gate portion 32, source-drain portion 33, for example) included in the transistor 26 and the first wiring unit 341 is so short in comparison with that of the wiring unit (first wiring unit 341, for example) that the adverse effect due to the occurrence of a voltage drop can be neglected. Therefore, the occurrence of the delays described above can be minimized.

Figure 5:
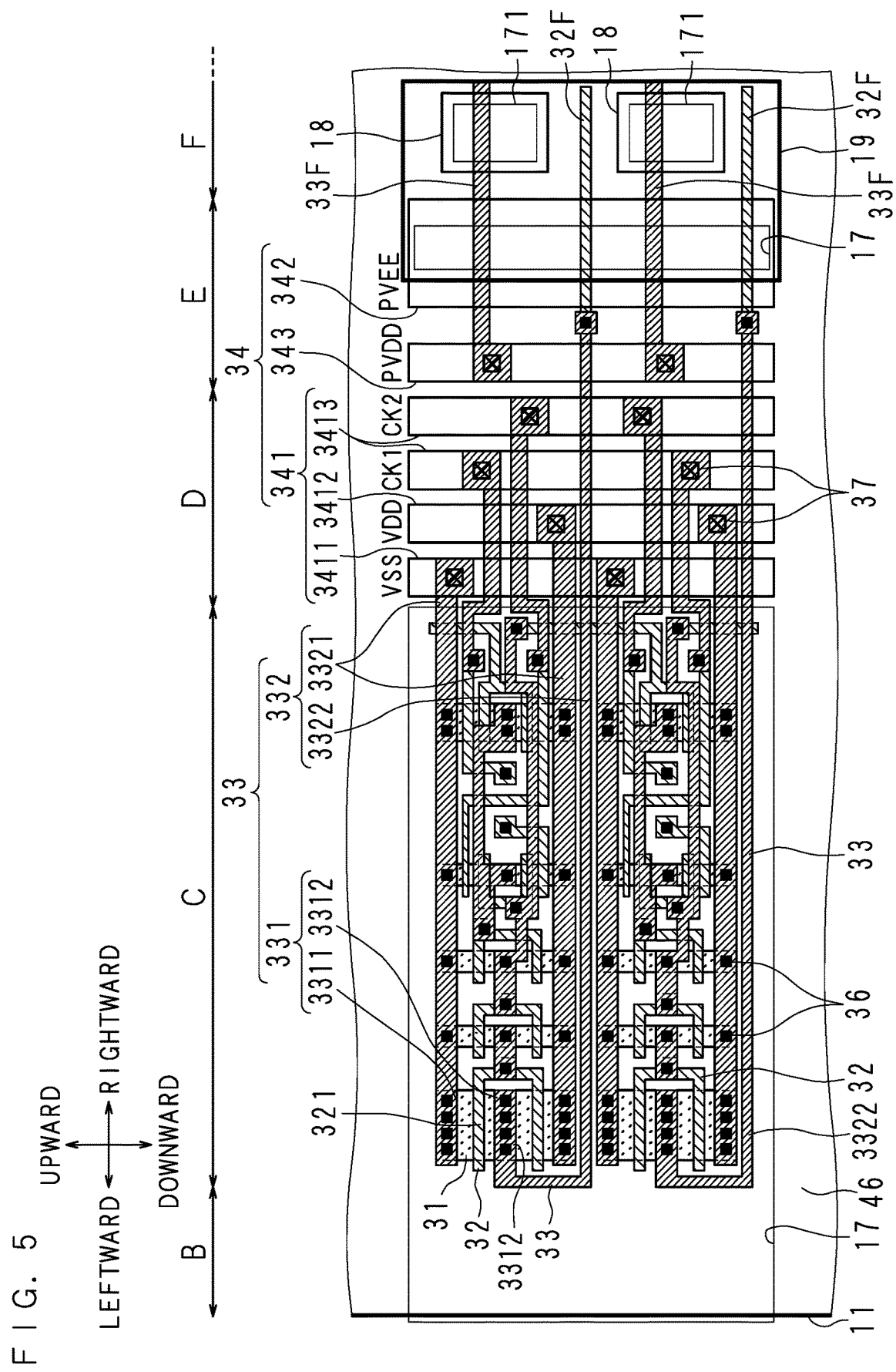
FIG. 5 is a schematic plan view of a display device.

FIG. 5 is a schematic plan view of the display device 10. FIG. 5 is a drawing illustrating the semiconductors and wirings provided at the left part of the display device 10 illustrated in FIG. 1 in an enlarged scale. In FIG. 5, the first substrate 11, the sealant 25, the inorganic insulator film 44 and the like are not illustrated. The respective regions (B-F) illustrated in FIG. 5 correspond to regions in FIG. 3 when viewed from the front of the display device 10. It is noted that three or more transistors are actually disposed in the seal region C although two transistors 26 are schematically illustrated in the seal regions C in FIG. 3.

It is noted that this embodiment exemplify a case that a complementary metal oxide semiconductor (CMOS) transistor is employed for the transistor of the driving circuit 20.

With reference to FIG. 5, a brief overview of the disposition of the semiconductors and the wirings are discussed below. As illustrated in FIG. 5, there is no wirings in the margin region B.

The seal region C will be described. In the seal region C, a number of transistors each including the semiconductor portion 31, the gate portion 32 and the source-drain portion 33 are arranged. The semiconductor portion 31 is a layer made of polycrystalline silicon. The gate portion 32 is a layer made of a refractory metal. The gate portion 32 includes a gate electrode 321. The gate electrode 321 is a part where the semiconductor portion 31 and the gate portion 32 overlap.

The source-drain portion 33 is made of a refractory metal. The refractory metal is a high-melting-point pure metal such as molybdenum, titanium, tungsten or the like. The refractory metal may be molybdenum/niobium, molybdenum/tungsten, molybdenum/tantalum or the like. Here, "/" means both a laminate of the former and the latter metals, and an alloy containing the former and the latter metals. Furthermore, the refractory metal may be a laminate of a pure metal and an alloy. The materials listed above are mere examples and do not limit the materials of the refractory metal to the metal materials listed above.

The semiconductor portion 31, the gate portion 32 and the source-drain portion 33 are connected via a first contact hole 36.

The source-drain portion 33 of the seal region C includes a source-drain electrode portion 331 of the transistor. The source-drain electrode portion 331 includes a source electrode 3311 and a drain electrode 3312 of the transistor. As described above, the source-drain electrode portion 331 and the gate electrode 321 are examples of the electrode portions included in the transistor of the driving circuit 20 according to this embodiment.

According to this embodiment, the gate portion 32 and the source-drain portion 33 are made of the same refractory metal material. Accordingly, the gate electrode 321, the source electrode 3311 and the drain electrode 3312 are made of the same refractory metal.

It is noted that the gate portion 32 and the source-drain portion 33 may be made of different refractory metal materials.

The first power supply region D will be described. In the first power supply region D, the source-drain portion 33 extending to the right from the seal region C and the first wiring unit 341 extending in a direction vertical to the sheet of the drawing are disposed. The first wiring unit 341 is a part of the low-melting-point wiring layer 34 made of a low-melting-point metal. The low-melting-point metal includes metals generally used for wirings, such as aluminum, copper and gold, and has a lower melting point than the above-mentioned refractory metal.

The first wiring unit 341 includes a VSS wiring 3411 for supplying low power supply VSS and a VDD wiring 3412 for supplying high power supply VDD to the transistors of the driving circuit 20, for example. Also, the first wiring unit 341 includes two clock wirings 3413. The first clock wiring 3413 supplies a clock CK1 to the transistor of the driving circuit 20, and the second clock wiring 3413 supplies a clock CK2 to the transistor of the driving circuit 20, for example. That is, the first wiring unit 341 corresponds to wirings for supplying voltage to the transistors included in the driving circuit 20.

The source-drain portion 33 includes a second wiring unit 332. The second wiring unit 332 connects between the electrode portion included in the transistors of the driving circuit 20 and the first wiring unit 341. The second wiring unit 332 includes a second source wiring 3321 and a second drain wiring 3322, for example. The electrode portion is the source electrode 3311, the drain electrode 3312, or the gate electrode 321, for example.

The second source wiring 3321 extends from the source electrode 3311 to the right, that is, toward the first wiring unit 341. The second source wiring 3321 connects between the source electrode 3311 and the VSS wiring 3411 or the VDD wiring 3412. The second source wiring 3321 is connected to the VSS wiring 3411 or the VDD wiring 3412 via the second contact hole 37 at the right end. That is, the second source wiring 3321 connects to the first wiring unit 341 via the second contact hole 37 at the right end.

The second drain wiring 3322 connects between the drain electrode 3312 and the first drain wiring included in the first wiring unit 341. The second drain wiring 3322 extends from the seal region C to the right, that is, toward the first wiring unit 341. The second drain wire 3322 is connected to the first wiring unit 341 via the contact hole (not illustrated) at the right end. It is noted that the contact portion between the second drain wiring 3322 and the first wiring unit 341 are not illustrated.

The second power supply region E will be described. In the second power supply region E, a cathode wiring unit 342, a third wiring unit 343, a gate portion 32F and a source-drain portion 33F are disposed. The cathode wiring unit 342 and the third wiring unit 343 extend vertically.

The gate portion 32F is a layer made of the same material as and formed in the same process as the gate portion 32 of the seal region C. The source-drain portion 33F is a layer made of the same material as and formed in the same process as the source-drain portion 33 of the seal region C and the first power supply region D. The gate portion 32F and the source-drain portion 33F extend toward the display region F.

The cathode wiring unit 342 is a cathode power supply wiring for supplying analog negative power PVEE to the cathode electrode 19. The third wiring unit 343 is an anode power supply wiring for supplying an analog positive power PVDD to the pixel circuits. The cathode wiring unit 342 and the third wiring unit 343 are parts of the low-melting-point wiring layer 34.

The gate portion 32F and the source-drain portion 33F supply analog power to the pixel circuits in the display region F. The cathode wiring unit 342 and the cathode electrode 19 are connected via an opening portion 17 at the position where they overlap. It is noted that the opening portion 17 is also called an element isolation layer opening portion. The gate portion 32F is connected to the source-drain portion 33F.

The display region F will be described. In the display region F, the anode electrodes 18 and the light-emitting portions 171 are disposed. It is noted that the wirings and the semiconductors of the pixel circuits are not illustrated. The anode electrode 18 is made of the same material as that of the low-melting-point wiring layer 34, for example. The anode electrode 18 can be formed in the same process as that of the low-melting-point wiring layer 34. Each of the light-emitting portions 171 is disposed so as to overlap the anode electrode 18. The light-emitting portion 171 is a part where each OLED 97 (see FIG. 26) emits light. The display unit 15 includes a number of OLEDs 97.

Figure 6:
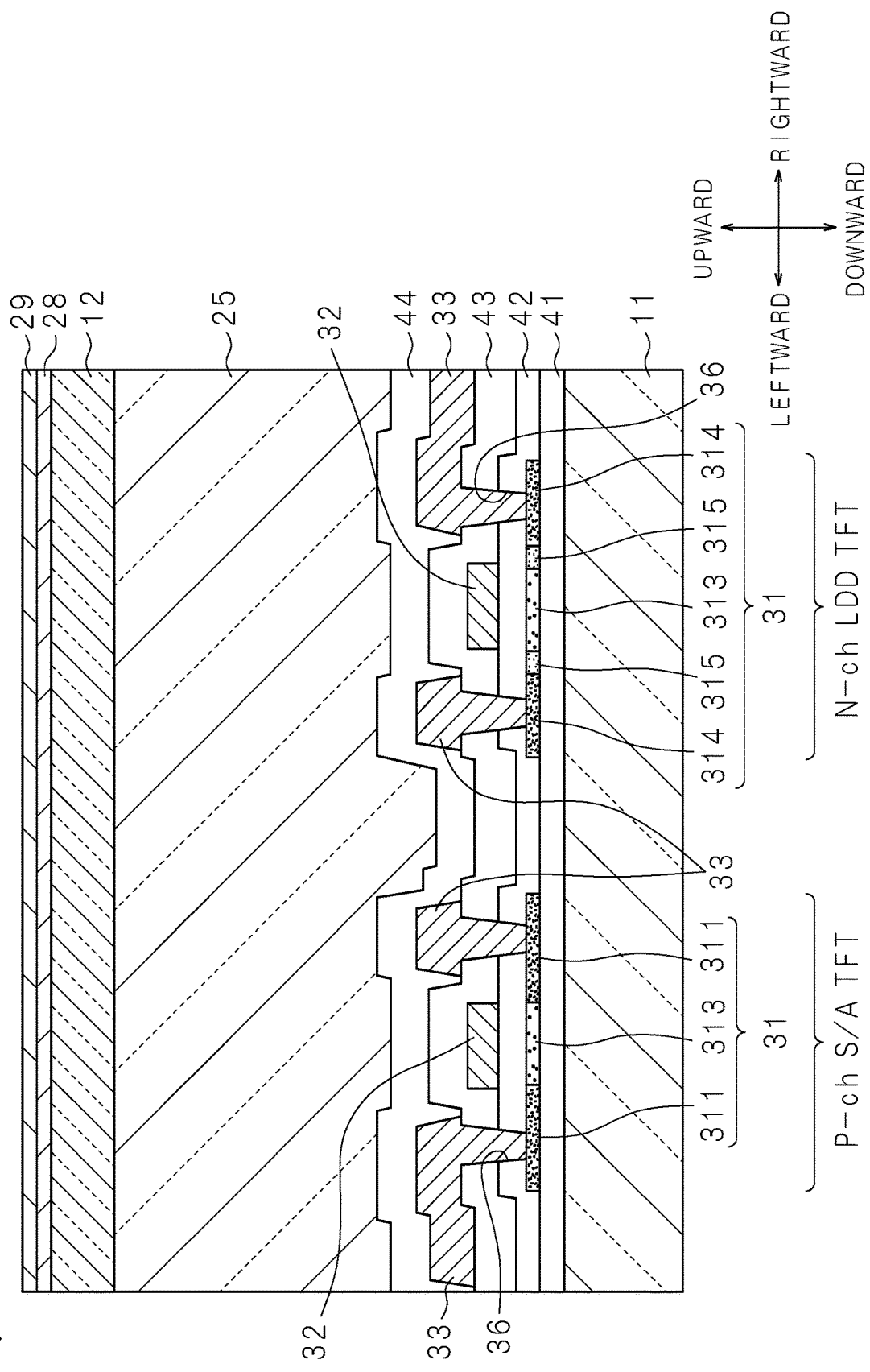
FIG. 6 is a schematic cross-sectional view of a seal region.

FIG. 6 is a schematic cross-sectional view of the seal region C. FIG. 6 schematically illustrates a part including two transistors out of a number of transistors disposed in the seal region C similarly to FIG. 3. With reference to FIG. 6, the structure of the seal region C will be described. It is noted that in the following description of the cross-sectional view, the rear side of the display device 10, that is, the side of the first substrate 11 is regarded as a downward direction, and the front side of the display device 10, that is, the side of the second substrate 12 is regarded as an upward direction.

The display device 10 has, on the first substrate 11, a base insulating layer 41, a semiconductor portion 31, a gate insulating layer 42, a gate portion 32, an interlayer insulating layer 43, a source-drain portion 33, an inorganic insulator film 44, a sealant 25, a second substrate 12, a quarter-wavelength retarder 28 and a polarizing plate 29.

The base insulating layer 41 is disposed on the entire surface of the first substrate 11. The semiconductor portion 31 is disposed on the base insulating layer 41. The gate insulating layer 42 is disposed on the semiconductor portion 31 and a part of the base insulating layer 41 that is not covered by the semiconductor portion 31. The gate portion 32 is disposed on the gate insulating layer 42. The interlayer insulating layer 43 is disposed on the gate portion 32 and a part of the gate insulating layer 42 that is not covered by the gate portion 32. The source-drain portion 33 is disposed on the interlayer insulating layer 43. The inorganic insulator film 44 is disposed on the source-drain portion 33 and a part of the interlayer insulating layer 43 that is not covered by the source-drain portion 33. The sealant 25 tightly fills in the space between the inorganic insulator film 44 and the second substrate 12.

The quarter-wavelength retarder 28 is disposed on the second substrate 12. The polarizing plate 29 is disposed on the quarter-wavelength retarder 28. The source-drain portion 33 is connected to the semiconductor portion 31 via the first contact hole 36.

The gate insulating layer 42, the interlayer insulating layer 43 and the inorganic insulator film 44 each have a predetermined thickness, and are formed to conform to the irregularities of the layers below them.

The first substrate 11, the base insulating layer 41, the semiconductor portion 31, the gate insulating layer 42, the interlayer insulating layer 43, the inorganic insulator film 44, the sealant 25 and the second substrate 12 are made of inorganic materials. The gate portion 32 and the source-drain portion 33 are made of refractory metals. That is, the seal region C is made only by inorganic materials and refractory metals other than the quarter-wavelength retarder 28 and the polarizing plate 29.

The semiconductor portion 31, the gate portion 32 and the source-drain portion 33 at the left in FIG. 6 constitute a p-channel super aluminum thin film transistor (P-ch S/A TFT). The left-hand semiconductor portion 31 includes a p-type heavily doped layer 311 and an undoped layer 313. The semiconductor portion 31, the gate portion 32 and the source-drain portion 33 at the right in FIG. 6 constitute an n-channel lightly doped drain thin film transistor (N-ch LDD TFT). The right-hand semiconductor portion 31 includes an undoped layer 313, an n-type heavily doped layer 314 and an n-type lightly doped layer 315. The P-ch S/A TFT and the N-ch LDD TFT are examples of the transistors constituting the driving circuit 20. The P-ch S/A TFT and the N-ch LDD TFT illustrated in FIG. 6 correspond to the transistors 26 illustrated in FIG. 3.

The right-hand source-drain portion 33 of the N-ch LDD TFT disposed at the rightmost end of the seal region C is coupled to the second wiring unit 332 (see FIG. 3) extending toward the first power supply region D.

Figure 7:
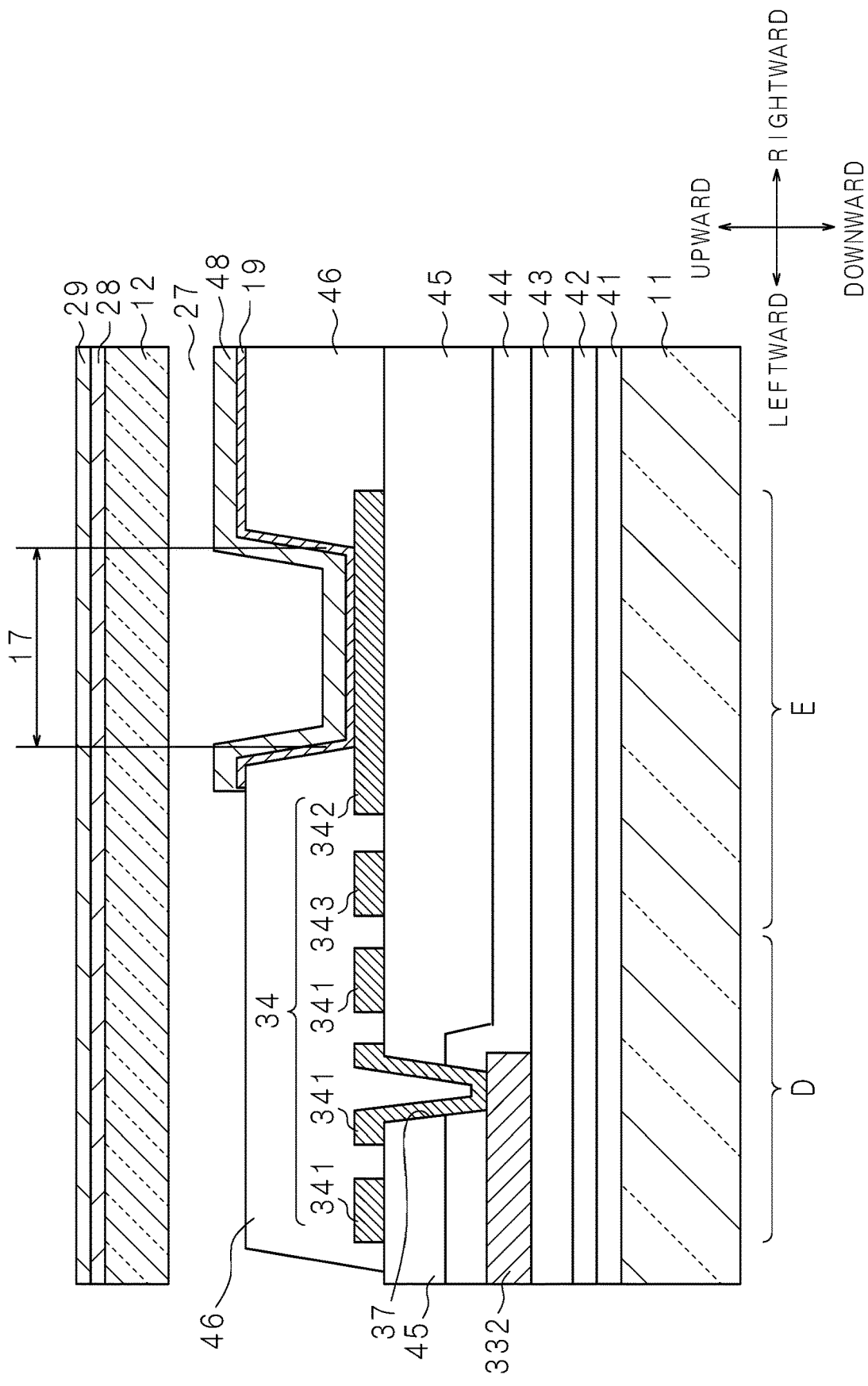
FIG. 7 is a schematic cross-sectional view of a first power supply region and a second power supply region.

FIG. 7 is a schematic cross-sectional view of the first power supply region D and the second power supply region E. With reference to FIG. 7, the structures of the first power supply region D and the second power supply region E are described. It is noted that the description of the parts equivalent to the seal region C described with reference to FIG. 6 will not be repeated.

The display device 10 has, on the first substrate 11, the base insulating layer 41, the gate insulating layer 42, the interlayer insulating layer 43, the second wiring unit 332, the inorganic insulator film 44, the planarization layer 45, the low-melting-point wiring layer 34, an isolation layer 46, the cathode electrode 19, a cap layer 48, the second substrate 12, the quarter-wavelength retarder 28 and the polarizing plate 29.

The base insulating layer 41 is disposed on the entire surface of the first substrate 11. The gate insulating layer 42 is disposed on the base insulating layer 41. The interlayer insulating layer 43 is disposed on the gate insulating layer 42. The second wiring unit 332 is disposed on the interlayer insulating layer 43. The inorganic insulator film 44 is disposed on the second wiring unit 332 and a part of the interlayer insulating layer 43 that is not covered by the second wiring unit 332.

The planarization layer 45 is disposed on the inorganic insulator film 44. The low-melting-point wiring layer 34 is disposed on the planarization layer 45. As the low-melting-point wiring layer, conventional low-resistance wire materials, such as Al, Cu, or wire materials of a multi-layer structure with the layers of these resistance wire materials and refractory metal films may be used. However, using the same material as the anode electrode material 342 as illustrated enables a simple manufacturing process. The low-melting-point wiring layer 34 is used for the wirings of the main part of the circuit, such as power supply wirings and clock wirings. Accordingly, preferable are materials and film structures that enable low resistance equal to or less than the upper limit required for a circuit design and high reflectivity required for the anode electrode. A laminate film of ITO/Ag, for example, enables low resistance as well as high reflectivity, and also achieves a function as the anode electrode. Another metal thin film may be added below the laminate film to thereby reduce contact resistance with the refractory metal film 332.

The isolation layer 46 is disposed on the low-melting-point wiring layer 34 and a part of the planarization layer 45 that is not covered by the low-melting-point wiring layer 34. It is noted that the isolation layer 46 is called an element isolation layer. The cathode electrode 19 is disposed on the isolation layer 46. The cap layer 48 is disposed on the cathode electrode 19. It is noted that the cap layer 48 also covers the periphery of the cathode electrode 19. The cap layer 48 and a part of the isolation layer 46 that is not covered by the cap layer 48 are opposed to the second substrate 12 via the space 27.

The quarter-wavelength retarder 28 is disposed on the second substrate 12. The polarizing plate 29 is disposed on the quarter-wavelength retarder 28. This structure allows light entered from the outside and reflected by the surfaces of the second substrate 12, the cathode electrode 19, the anode electrode 342 or the like to be absorbed in the polarizing plate 29, and only the light emitted by the OLEDs to pass through the front surface. Therefore, a high contrast ratio is made possible. The cathode electrode 19 is connected to the low-melting-point wiring layer 34 via the opening portion 17 to thereby supply current required for lighting the OLEDs to the OLEDs.

The planarization layer 45 and the isolation layer 46 are made of organic materials. The planarization layer 45 covers the top surface of the inorganic insulator film 44. The planarization layer 45 is flat on the top surface except for the second contact hole 37.

The second wiring unit 332 extends from the right end of the seal region C to the interior of the first power supply region D. That is, the second wiring unit 332 is connected to the right-hand source-drain portion 33 of the N-ch LDD TFT described above.

The low-melting-point wiring layer 34 includes the first wiring unit 341, the cathode wiring unit 342 and the third wiring unit 343, for example. The first wiring unit 341 is connected to the source-drain portion 33 via the second contact hole 37.

The isolation layer 46 covers the low-melting-point wiring layer 34. The isolation layer 46 is not present at the left end of the first power supply region D, that is, at the left of the boundary portion between the seal region C and the first power supply region D.

The cathode electrode 19 is connected to the cathode wiring unit 342. The connected portion between the cathode electrode 19 and the cathode wiring unit 342 corresponds to the opening portion 17 included in the isolation layer 46. The cap layer 48 is placed on the cathode electrode 19. Between the top surface of the cap layer 48 and the second substrate 12, the space 27 is formed.

It is noted that the planarization layer 45, the isolation layer 46 and the cap layer 48 are made of organic materials. The low-melting-point wiring layer 34 and the cathode electrode 19 are made of low-melting-point metals.

Figure 8:
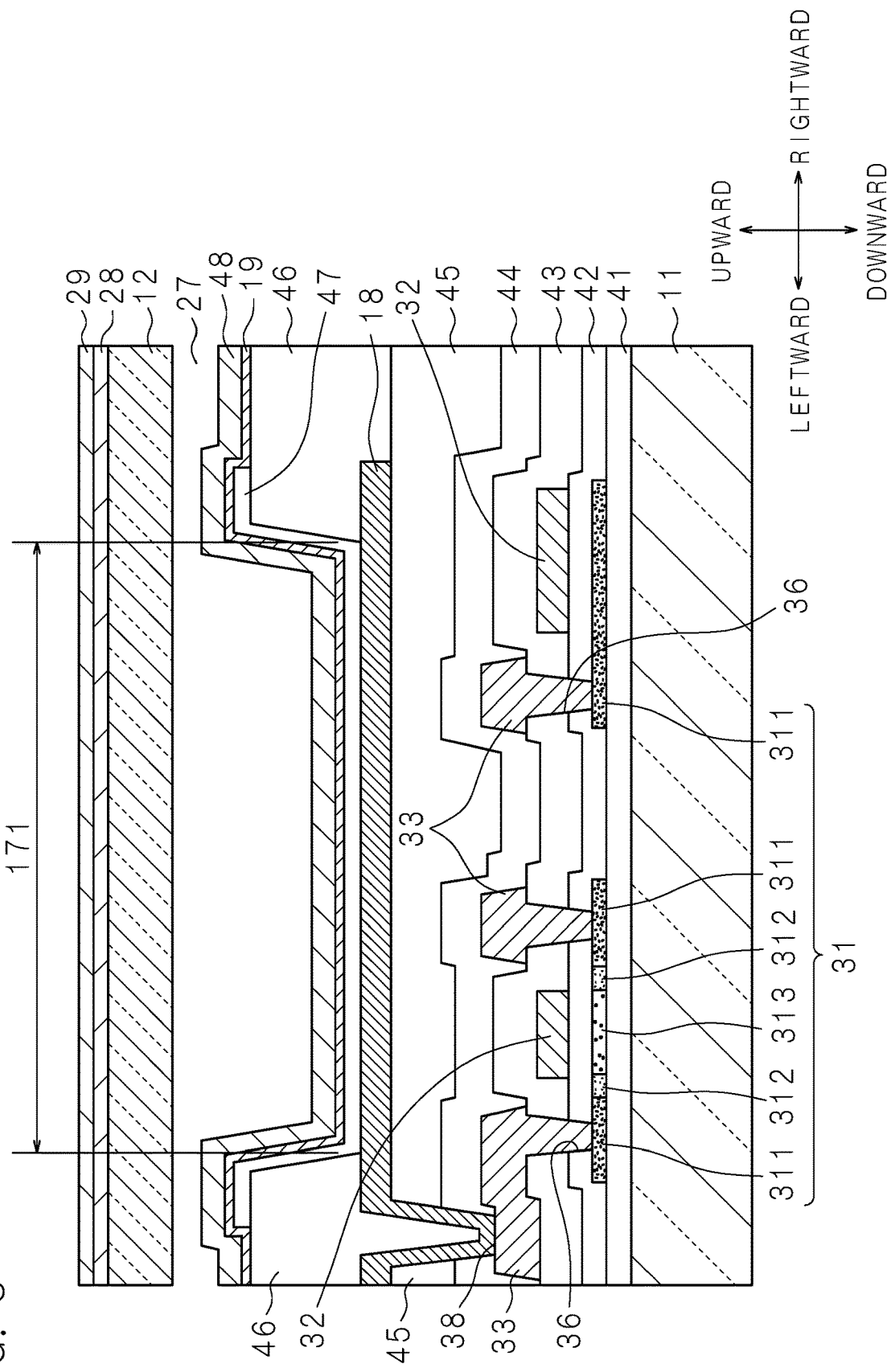
FIG. 8 is a schematic cross-sectional view of a display region.

FIG. 8 is a schematic cross-sectional view of the display region F. With reference to FIG. 8, the structure of the display region F will be described. It is noted that the parts equivalent to the seal region C discussed with reference to FIG. 6 will not be described. Furthermore, the parts equivalent to the first power supply region D and the second power supply region E discussed with reference to FIG. 7 will not be described.

The display device 10 has, on the first substrate 11, the base insulating layer 41, the semiconductor portion 31, the gate insulating layer 42, the interlayer insulating layer 43, the source-drain portion 33, the inorganic insulator film 44, the planarization layer 45, the anode electrode 18, the isolation layer 46, a light emitting layer 47, the cathode electrode 19, the cap layer 48, the second substrate 12, the quarter-wavelength retarder 28 and the polarizing plate 29.

The base insulating layer 41 is disposed on the entire surface of the first substrate 11. The semiconductor portion 31 is disposed on the base insulating layer 41. The gate insulating layer 42 is disposed on the semiconductor portion 31 and a part of the base insulating layer 41 that is not covered by the semiconductor portion 31. The gate portion 32 is disposed on the gate insulating layer 42. The interlayer insulating layer 43 is disposed on the gate portion 32 and a part of the gate insulating layer 42 that is not covered by the gate portion 32. The source-drain portion 33 is disposed on the interlayer insulating layer 43. The inorganic insulator film 44 is disposed on the source-drain portion 33 and a part of the interlayer insulating layer 43 that is not covered by the source-drain portion 33.

The planarization layer 45 is disposed on the inorganic insulator film 44. The anode electrode 18 is disposed on the planarization layer 45. The isolation layer 46 is disposed on the anode electrode 18 and a part of the planarization layer 45 that is not covered by the anode electrode 18. The light emitting layer 47 is disposed on the isolation layer 46. The cathode electrode 19 is disposed on the light emitting layer 47 and a part of the isolation layer 46 that is not covered by the light emitting layer 47. The cap layer 48 is disposed on the cathode electrode 19. The cap layer 48 is opposed to the second substrate 12 via the space 27.

The quarter-wavelength retarder 28 is disposed on the second substrate 12. The polarizing plate 29 is disposed on the quarter-wavelength retarder 28. The anode electrode 18 is connected to the source-drain portion 33 via the contact portion 38.

The semiconductor portion 31, the gate portion 32 and the source-drain portion 33 at the left in FIG. 8 constitutes a thin-film transistor (TFT). The semiconductor portion 31, the gate portion 32 and the source-drain portion 33 at the right in FIG. 8 constitutes a retention capacitor. All of them are examples of circuit components of the pixel circuit.

The anode electrode 18 is connected to the source-drain portion 33 of the TFT via the contact portion 38. The isolation layer 46 covers the planarization layer 45 and the periphery of the anode electrode 18, and does not cover the center of the anode electrode 18.

The light emitting layer 47 is a layer made of an organic compound that emits light based on the flow of current, that is, an OLED layer. The light emitting layer 47 is formed on the anode electrode 18 exposed through the opening of the isolation layer 46 and the surrounding thereof. The cathode electrode 19 covers the light emitting layer 47 and the isolation layer 46.

The operation of the light emitting layer 47 will be described. A voltage is applied to the anode electrode 18 via the contact portion 38. By the voltage difference between the anode electrode 18 and the cathode electrode 19, holes are injected from the anode electrode 18 to the light emitting layer 47 while electrons are injected from the cathode electrode 19 to the light emitting layer 47.

Excitons caused by the recombination between the holes and the electrons in the light emitting layer 47 emits light when returning to the ground state. That is, the light emitting layer 47 emits light based on the current between the anode electrode 18 and the cathode electrode 19. A part of the light emitting layer 47 where the isolation layer 46 is placed thereunder hinders the flow of current and thus does not emit light. From the above, the part of the anode electrode 18 exposed through the isolation layer 46 is the light-emitting portion 171.

As described above, the planarization layer 45, the isolation layer 46, the light emitting layer 47 and the cap layer 48 are made of organic materials. The anode electrode 18 and the cathode electrode 19 are made of low-melting-point metals. That is, the display region F includes organic materials and low-melting-point metals other than the retarder 28 and the polarizing plate 29.

According to the present embodiment, it is preferable that the material of the first wiring unit 341 has a lower sheet resistance than the material of the second wiring unit 332. That is, it is preferable that the sheet resistance of the low-melting-point wiring layer 34 is lower than that of the source-drain portion 33.

The sheet resistance of the first wiring unit 341 is preferably equal to or lower than 0.1 ohm, for example. In the case that a three-layer structure of ITO, silver and ITO is employed for the first wiring unit 341, the thick structure of the silver layer in the middle allows the sheet resistance to be equal to or lower than 0.1 ohm.

Here, the sheet resistance of the first wiring unit 341 means the sheet resistance at a part of the first wiring unit 341 being uniform in thickness away from the second contact hole 37 or the like. Also, the sheet resistance of the second wiring unit 332 means the sheet resistance of the second wiring unit 332 being uniform in thickness that is away from the first contact hole 36 or the like.

Figure 9:
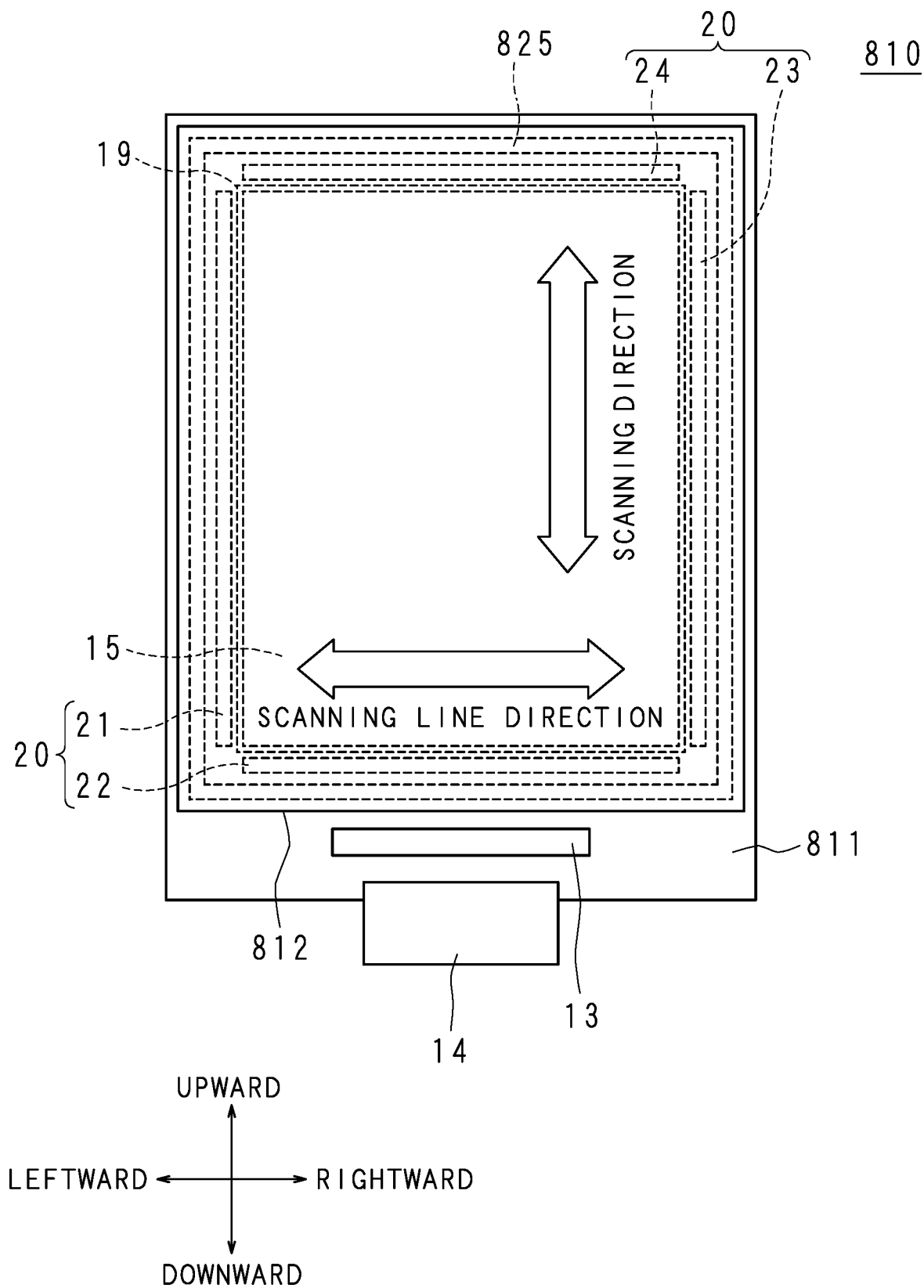
FIG. 9 is an external view of a display device according to a comparative example.

FIG. 9 is an external view of a display device 810 of a comparative example. FIG. 9 is a drawing of the display device 810 as seen from the front, that is, from the image display surface side. With reference to FIG. 1 and FIG. 9, the effect of the present embodiment will be described.

First, the display device 810 of the comparative example illustrated in FIG. 9 will be described. The parts equivalent to those in FIG. 1 will not be described. A sealant 825 sealing a first substrate 811 and a second substrate 812 according to the comparative example surrounds the scan driver 21, the demultiplexer 22, the emission control driver 23 and the protection circuit 24. The sealant 25 is positioned away from the scan driver 21, the demultiplexer 22, the emission control driver 23 and the protection circuit 24. In the comparative example, the transistors in the driving circuit 20 like the scan driver 21 or the like is less likely to suffer from heat at a time when the sealant 25 is melted.

In the comparative example, the bezel region surrounding the outer periphery of the display unit 15 needs the width including the width of the scan driver 21, the width of the sealant 825 and the space between them on the left side of the display unit 15, for example. In order to protect the scan driver 21 from the heat generated when the sealant 825 is melted, a space is required to be formed between the scan driver 21 and the sealant 825.

In contrast, in the display device 10 according to the present embodiment illustrated in FIG. 1, the scan driver 21 formed of refractory metals may be overlapped with the sealant 25. That is, the scan driver 21 can be disposed directly below the sealant 25. Therefore, in the display device 10 according to this embodiment, it is possible to narrow the bezel region by the width of the scan driver 21 and the width corresponding to the space between the scan driver 21 and the sealant 25 in comparison with the comparative example. Accordingly, it is possible to provide the display device 10 enabling a narrow bezel.

Next, the effect of the display device 10 according to the present embodiment will be described in terms of wiring structure. According to this embodiment, voltage is supplied from the first wiring unit 341 made of a low-melting-point metal to the transistors in the driving circuit 20 through the second wiring unit 332 made of a refractory metal. This allows the first wiring unit 341 made of a low-melting-point metal to be positioned away from the driving circuit 20. Accordingly, it is possible to protect the first wiring unit 341 from the adverse effect due to heat melting the sealant 25 provided over the driving circuit 20.

Also, using a low-melting-point metal having a low sheet resistance for the first wiring unit 341 enables stable supply of power and clock signal to the driving circuit 20, which can avoid malfunction.

In addition, the first wiring unit 341 and the anode electrode 18 can be formed in the same processes. Therefore, the display device 10 according to this embodiment can be manufactured in the same number of processes as that of the comparative example described with reference to FIG. 9. That is, it is possible to provide the display device 10 having a narrow bezel without increasing the number of manufacturing processes.

Figure 10:
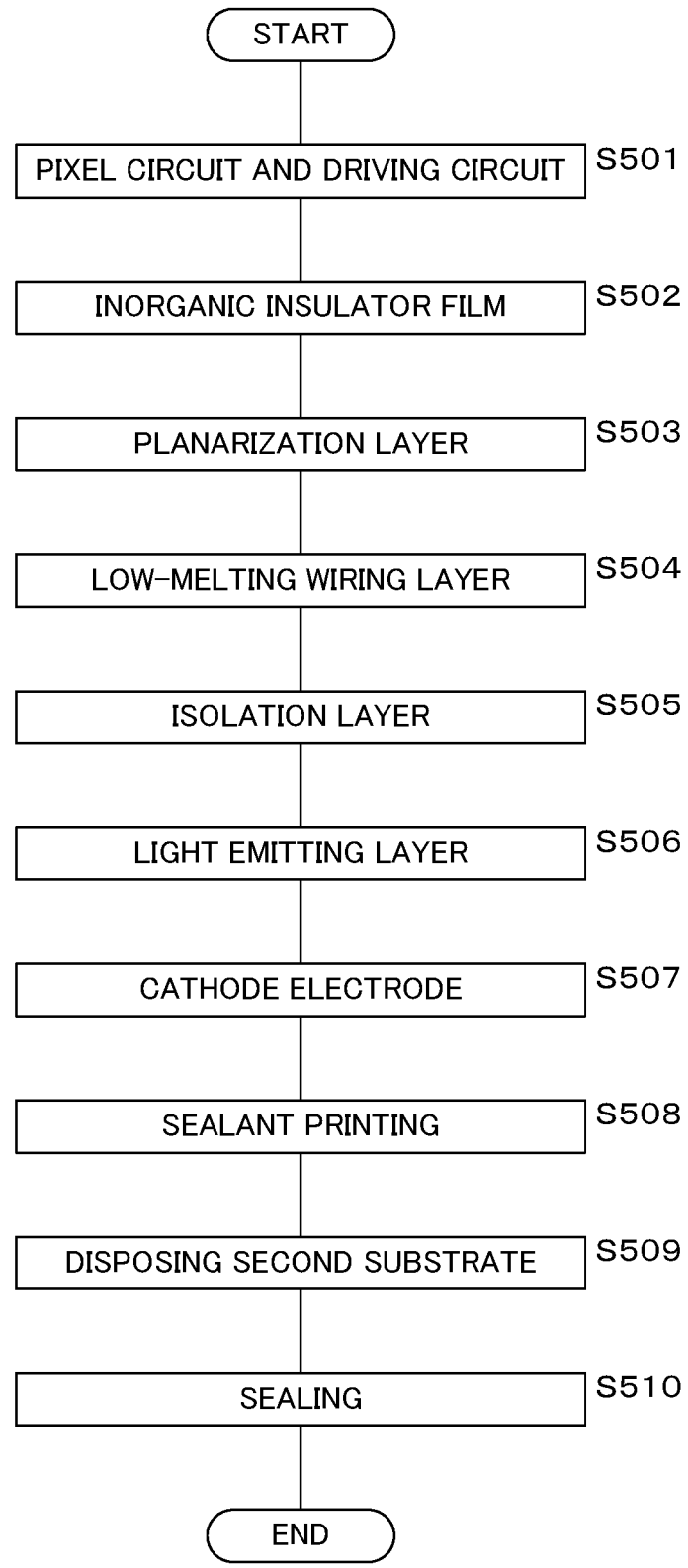
FIG. 10 is a flowchart illustrating a flow of a manufacturing process of the OLED panel.

FIG. 10 illustrates the flow of manufacturing an OLED panel. FIG. 11-FIG. 23 and FIG. 4 each illustrate the manufacturing process of the OLED panel. With reference to FIG. 10-FIG. 23 and FIG. 4, a brief overview of a method for manufacturing the display apparatus 10 according to this embodiment will be discussed below.

It is noted that with respect to the schematic cross-sectional view illustrated in FIG. 11, FIG. 13, FIG. 15, FIG. 17 and FIG. 19, the following description exemplifies a single OLED 97 (see FIG. 26) and a single pixel circuit that controls the OLED 97 within the display region F. Although in the schematic cross-sectional view, one TFT is presented for a single OLED 97, a single OLED 97 may be provided with a plurality of TFTs. Furthermore, since the processes of forming the p-type heavily doped layer 311, the p-type lightly doped layer 312, the undoped layer 313, the n-type heavily doped layer 314 and the n-type lightly doped layer 315 by doping the semiconductor portion 31 or the like are similar to the existing semiconductor manufacturing process, the explanation thereof will not be repeated.

The manufacturer of the display device 10 produces the pixel circuit and the driving circuit 20 on one of the surfaces of the first substrate 11 being a translucent substrate such as a glass substrate or the like by the semiconductor process (step S501). At this time, the manufacturer of the display device 10 uses refractory metals for electrodes and wirings that constitute the pixel circuit and the driving circuit 20.

Figure 11:
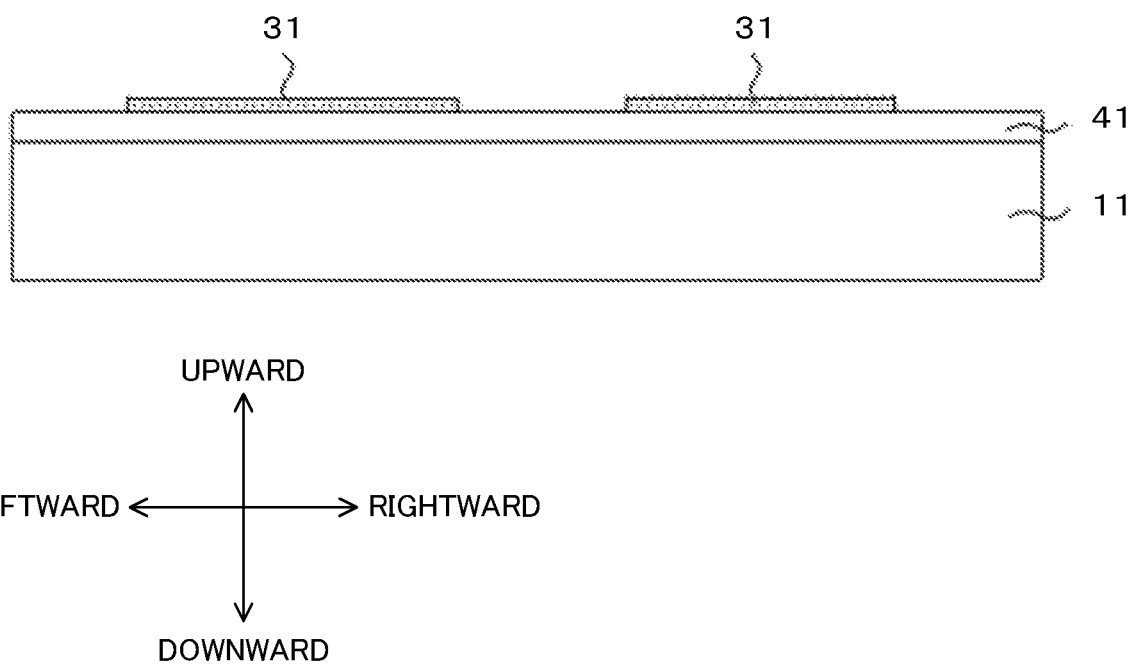
FIG. 11 illustrates a manufacturing process of the OLED panel.

The process in the step S501 will be discussed with reference to FIG. 11-FIG. 16. First, the process is discussed with reference to FIG. 11 and FIG. 12. FIG. 11 is a schematic cross-sectional view of the display device 10 in the middle of the manufacturing process. FIG. 12 is a drawing illustrating the display device 10 in the state illustrated in FIG. 11 as seen from the front side. FIG. 12 illustrates the same parts as FIG. 5.

The manufacturing apparatus of the display device 10 forms the base insulating layer 41 by depositing a silicon nitride film or the like on one surface of the first substrate 11 by a chemical vapor deposition (CVD) method or the like. Then, the manufacturing apparatus deposits amorphous silicon on the base insulating layer 41 by a CVD method or the like, and performs crystallization by excimer laser annealing (ELA) to thereby form the semiconductor portion 31 in a predetermined form.

Figure 14:
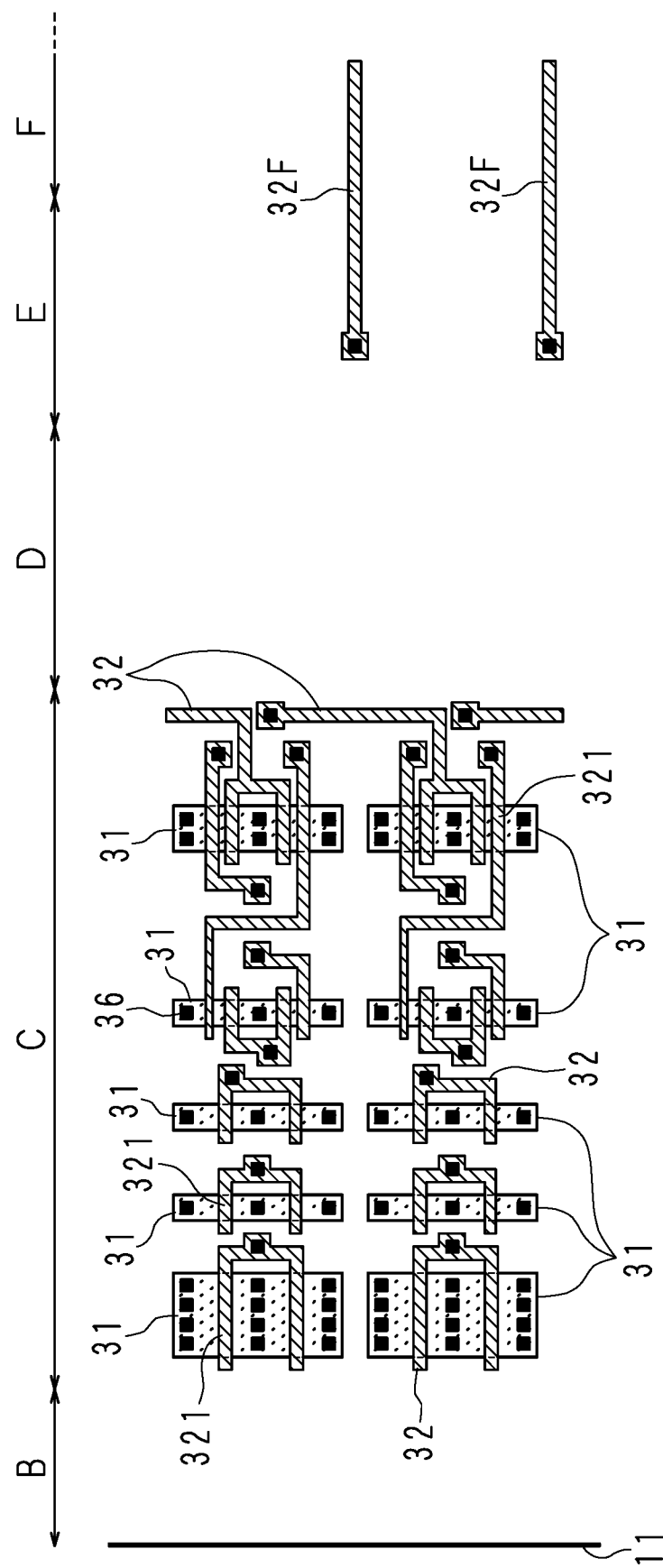
FIG. 14 illustrates a manufacturing process of the OLED panel.

The description continues with reference to FIG. 13 and FIG. 14. FIG. 13 is a schematic cross-sectional view illustrating the display device 10 in the middle of the manufacturing process. FIG. 13 is a drawing illustrating the display device 10 in the state illustrated in FIG. 14 as seen from the front side. FIG. 14 illustrates the same parts as FIG. 5. It is noted that the first contact hole 36 to be produced after this process is also illustrated in FIG. 14.

The manufacturing apparatus forms the gate insulating layer 42 by depositing silicon oxide film on the semiconductor portion 31 and the base insulating layer 41 by a CVD method or the like. The manufacturing apparatus laminates the gate portion 32 in a predetermined form by a spattering method. As described above, the gate portion 32 is made of refractory metal materials.

Some gate portions 32 located within the seal region C are the gate electrodes 321 and wirings for the transistors within the driving circuit 20. Other gate portions 32F extending to the right from the second power supply region E to display region F out of the gate portion 32 are wirings for supplying power to the pixel circuit.

Figure 16:
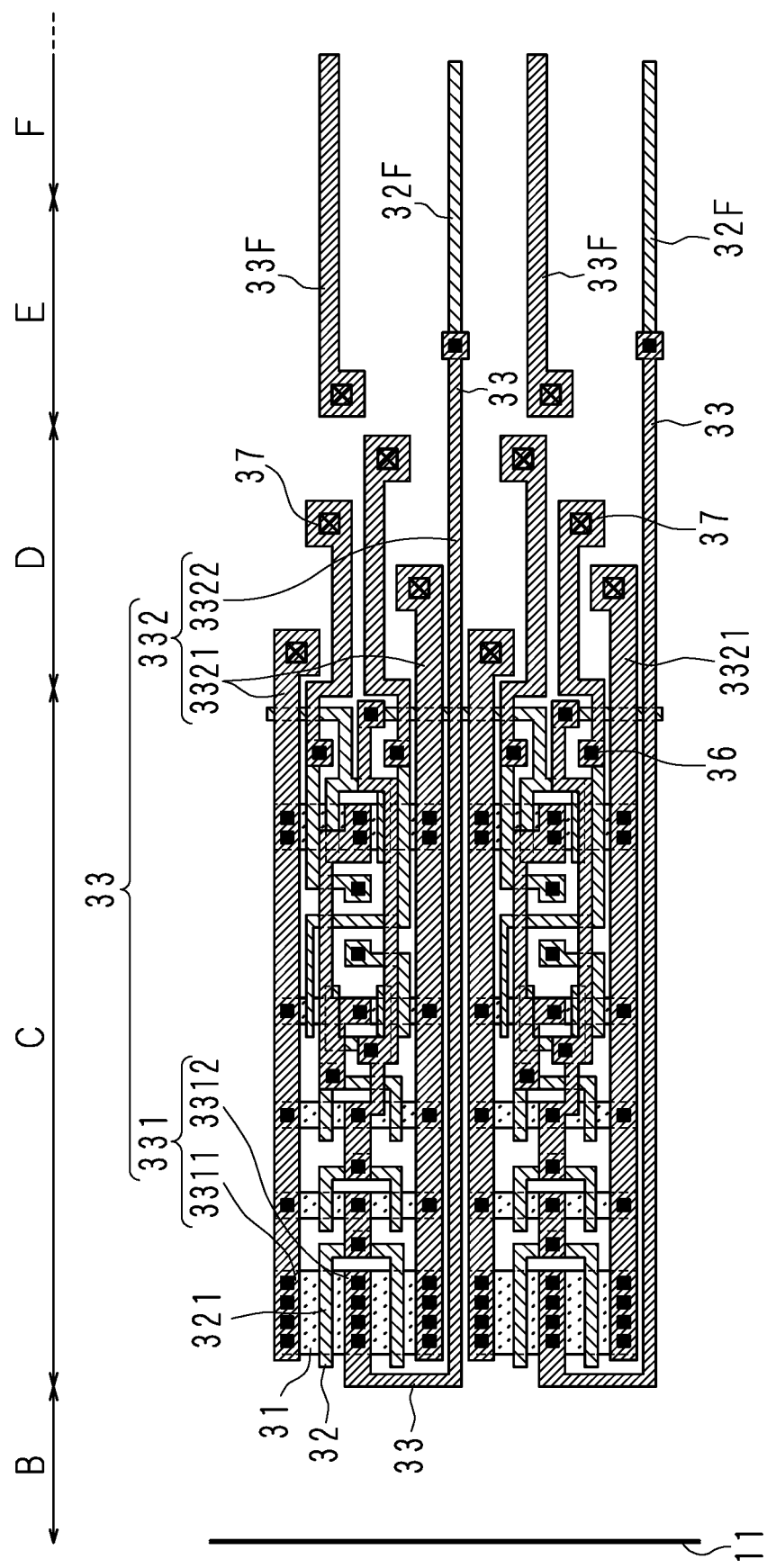
FIG. 16 illustrates a manufacturing process of the OLED panel.

The process is continuously discussed with reference to FIG. 15 and FIG. 16. FIG. 15 is a schematic cross-sectional view illustrating the display device 10 in the middle of the manufacturing process. FIG. 16 is a drawing illustrating the display device 10 in the state illustrated in FIG. 15 as seen from the front side. FIG. 16 illustrates the same parts as FIG. 5. It is noted that the second contact hole 37 to be produced after this process is also illustrated in FIG. 16.

The manufacturing apparatus of the display device 10 forms the interlayer insulating layer 43 by depositing a silicon oxide film, for example, by a CVD method or the like. The manufacturing apparatus performs anisotropic etching on the interlayer insulating layer 43 and the gate insulating layer 42 to form a hole passing through to the semiconductor portion 31. The manufacturing apparatus laminates the source-drain portion 33 in a predetermined form by the spattering method or the like. The hole passing through to the semiconductor portion 31 at this time will be the first contact hole 36 connecting the semiconductor portion 31 or the gate portion 32 and the source-drain portion 33 in the following process.

The respective parts of the source-drain portion 33 will be described below. The parts of the source-drain portion 33 near the first contact holes 36 connected to the semiconductor portion 31 within the seal region C are the source electrodes 3311 and the drain electrodes 3312. The first contact hole 36 connected to the gate portion 32 within the seal region C is connected to the gate electrode 321 via the gate portion 32.

The parts of the source-drain portion 33 that extend to the right from the seal region C and to be connected to the VSS wiring 3411 in the later process are the second source wirings 3321. The parts of the source-drain portion 33 extending to the right from the seal region C and to be connected to the VDD wiring 3412 in the later process are the second drain wirings 3322. The second source wirings 3321 and the second drain wirings 3322 are examples of the second wiring unit 332.

From the above, the step S501 illustrated in FIG. 10 is completed to thereby finish the transistor constituting the driving circuit 20.

As described above, the display device 10 includes the second wiring unit 332 connecting between the electrode portion (source electrode 3311, drain electrode 3312 and gate electrode 321, for example) included in the transistor and the first wiring unit 341. The display unit 15 and the first wiring unit 341 are disposed on a surface of the first substrate 11 within the space 27. The melting point of a second metal constituting the above-mentioned electrode portion and the second wiring unit 332 is higher than that of a first metal constituting the first wiring unit 341. The first substrate 11, the driving circuit 20, the sealant 25, and the second substrate 12 are layered.

The electrode portion included in the transistor and the second wiring unit 332 are made of the same metal. The second wiring unit 332 has the second source wiring 3321 connected to the source electrode 3311 of the electrode portion. The first wiring unit 341 has a first source wiring connected to the second source wiring 3321. The VSS wiring 3411 is one example of the first source wiring.

The second source wiring 3321 extends toward the first wiring unit 341 and is connected to the first source wiring at its end proximal to the first wiring unit 341.

The electrode portion included in the transistor and the second wiring unit 332 are composed of the same metal. The second wiring unit 332 has the second drain wiring 3322 connected to the drain electrode 3312 of the electrode portion. The first wiring unit 341 has a first drain wiring connected to the second drain wiring 3322. The VDD wiring 3412 is one example of the first drain wiring. The second drain wiring 3322 extends toward the first wiring unit 341, and is connected to the first drain wiring at its end proximal to the first wiring unit 341.

Figure 17:
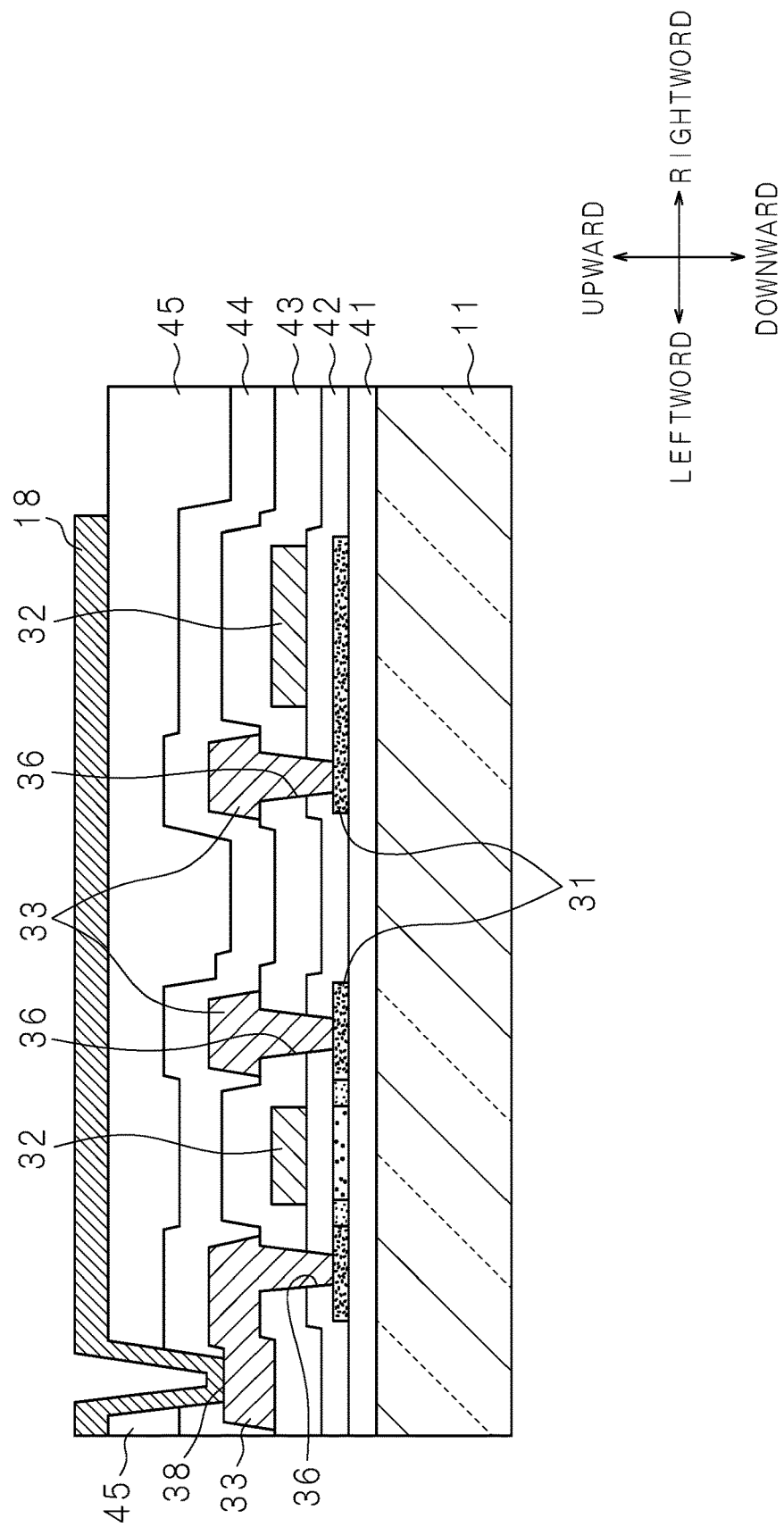
FIG. 17 illustrates a manufacturing process of the OLED panel.
Figure 18:
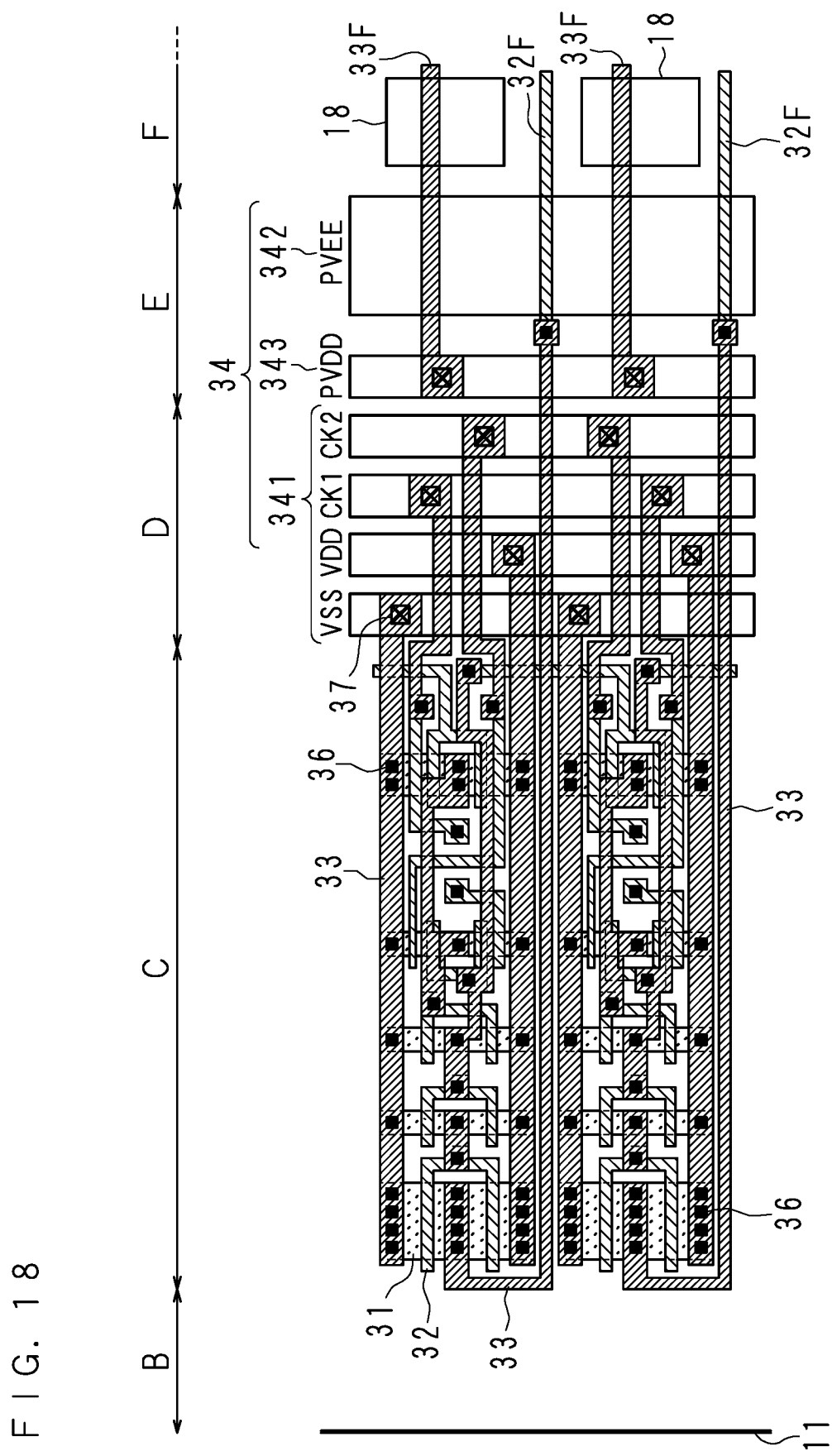
FIG. 18 illustrates a manufacturing process of the OLED panel.

The process is continuously discussed with reference to flowcharts illustrated in FIG. 17, FIG. 18 and FIG. 10. FIG. 17 is a schematic cross-sectional view of the display device 10 in the middle of the manufacturing process. FIG. 18 is a drawing illustrating the display device 10 in the state illustrated in FIG. 17 as seen from the front side. FIG. 17 illustrates the same parts as FIG. 5.

The manufacturing apparatus produces by a CVD method or the like the inorganic insulator film 44 that covers the interlayer insulating layer 43 and the source-drain portion 33 (step S502). The inorganic insulator film 44 is made of oxide silicon or nitride silicon, for example.

The manufacturing apparatus deposits photosensitive organic materials by a spin coating method or the like to thereby form the planarization layer 45 (step S503). The manufacturing apparatus produces the hole penetrating to the source-drain portion 33 by anisotropic etching or the like. The manufacturing apparatus removes the planarization layer 45 from the margin region B and the seal region C by anisotropic etching, etc.

The manufacturing apparatus produces the anode electrode 18 and the low-melting-point wiring layer 34 (step S504). More specifically, the deposition apparatus deposits a metal thin film on the front surface of the planarization layer 45 and the inner surface of the hole penetrating to the source-drain portion 33. A part of the metal thin film is removed by photolithography or the like to produce the anode electrode 18 and the low-melting-point wiring layer 34. It is noted that in this process, the manufacturing apparatus removes the metal thin film on the seal region C.

The hole passing penetrating to the source-drain portion 33 becomes the contact portion 38 connecting between the anode electrode 18 and the source-drain portion 33 or the second contact hole 37 connecting between the low-melting-point wiring layer 34 and the source-drain portion 33.

It is preferable that the anode electrode 18 has a three-layer structure of ITO, silver and ITO, for example. Such a structure allows the anode electrode 18 to serve as a reflective layer for reflecting the light emitted by the light emitting layer 47 toward the second substrate 12. Accordingly, it is possible to efficiently utilize the light emitted by the light emitting layer 47.

Furthermore, the anode electrode 18 may be a two-layer structure of aluminum and ITO. In place of aluminum, an alloy of aluminum and nickel or an alloy of aluminum and titanium may be used.

The low-melting-point wiring layer 34 may be a laminate obtained by laminating the same materials as the anode electrode 18 in the same order as the anode electrode 18. This makes it possible to produce the low-melting-point wiring layer 34 and the anode electrode 18 in the same processes.

The low-melting-point wiring layer 34 and the anode electrode 18 may share a part of the layers. Furthermore, the low-melting-point wiring layer 34 and the anode electrode 18 may be made of different materials.

Figure 19:
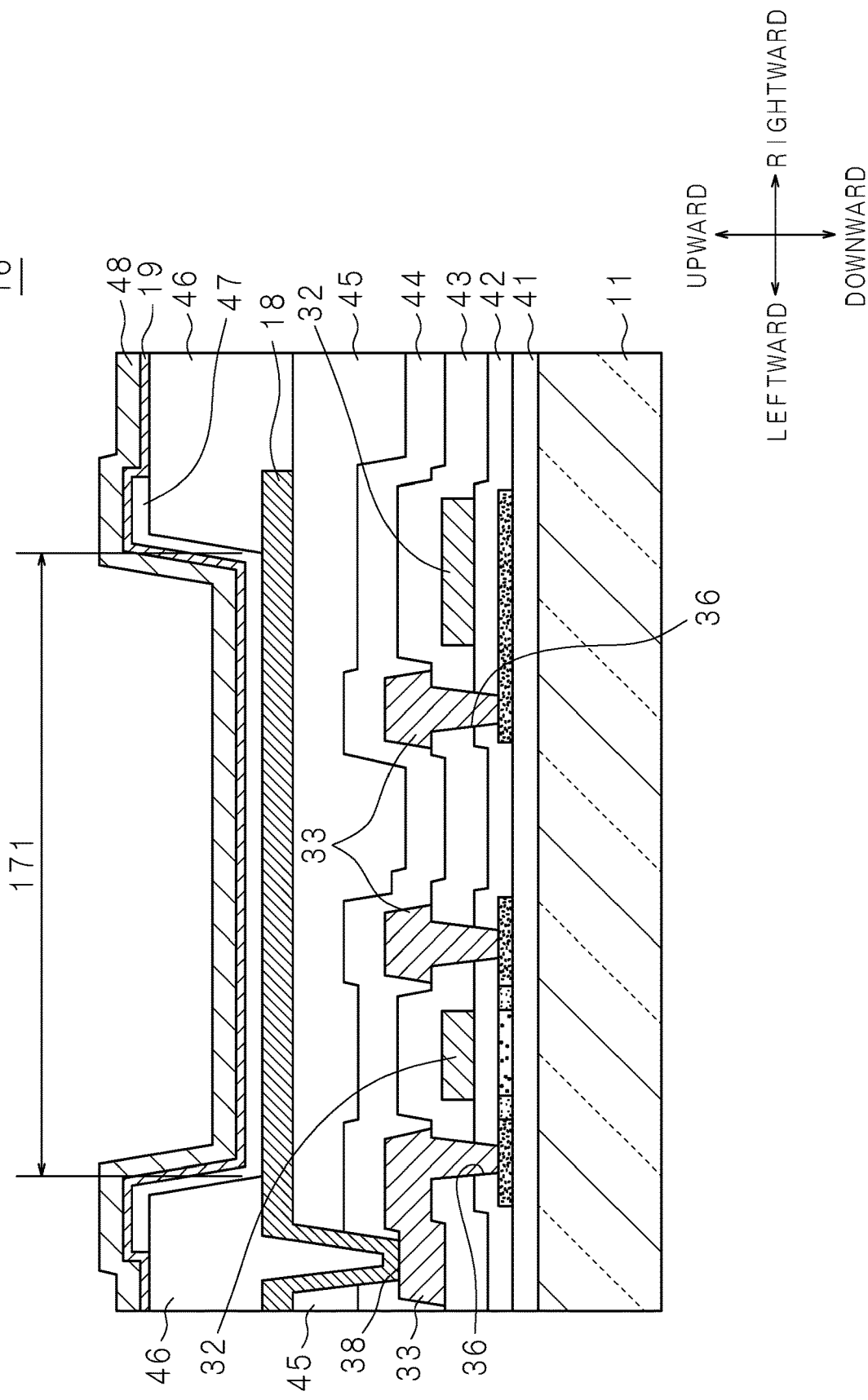
FIG. 19 illustrates a manufacturing process of the OLED panel.
Figure 20:
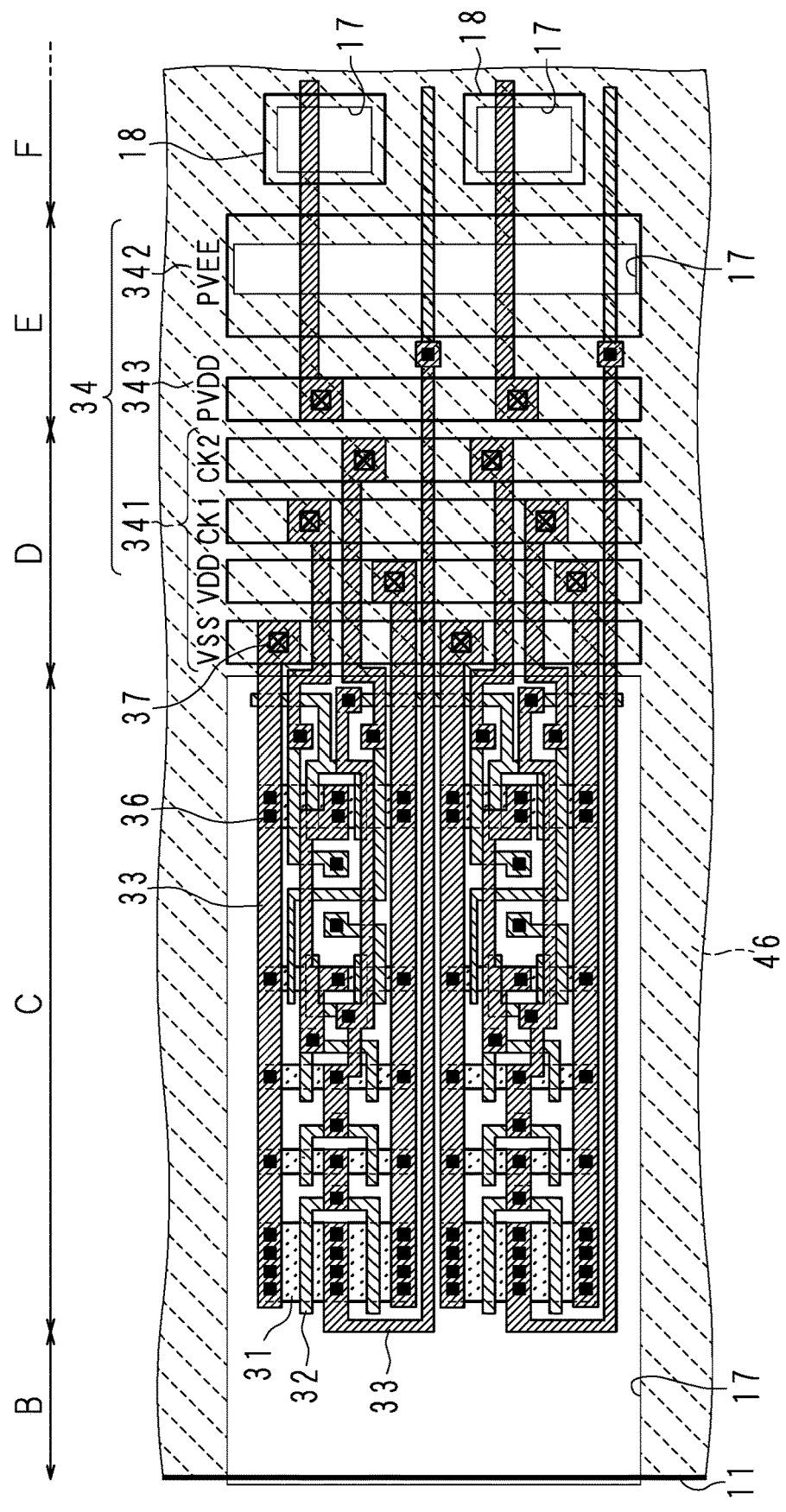
FIG. 20 illustrates a manufacturing process of the OLED panel.

The process is continuously discussed with reference to FIG. 19, FIG. 20, and the flowchart illustrated in FIG. 10. FIG. 19 is a schematic cross-sectional view illustrating the display device 10 in the middle of the manufacturing process. FIG. 20 is a drawing illustrating the display device 10 as seen from the front side after completion of the step S505 in the flowchart illustrated in FIG. 10. FIG. 19 illustrates the same parts as FIG. 5.

The manufacturing apparatus produces the isolation layer 46 (step S505). More specifically, a spin coating apparatus laminates a photosensitive organic resin film, for example. An exposure apparatus exposes a pattern corresponding to the shape of the opening portion 17. A development apparatus and an etch apparatus remove a part of the isolation layer 46 corresponding to the opening portion 17, to thereby produce the isolation layer 46 in a predetermined form. The isolation layer 46 is illustrated by cross-hatching by dashed lines in FIG. 20.

The manufacturing apparatus produces the light emitting layer 47 (step S506). More specifically, the light emitting layer 47 in a predetermined form is evaporated with the use of a metal mask. The light emitting layer 47 is made of three types of organic light emitting materials including red, blue and green.

Figure 21:
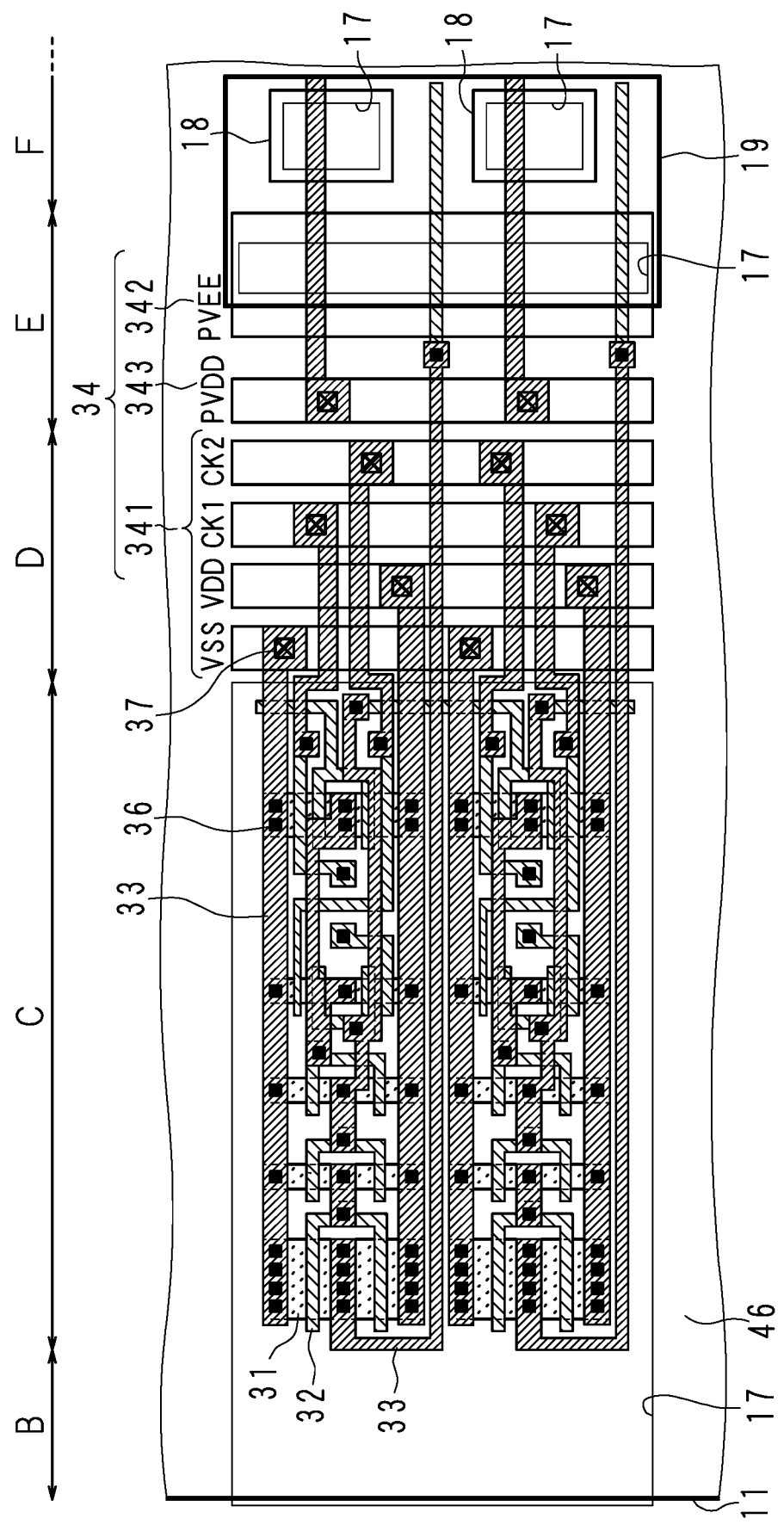
FIG. 21 illustrates a manufacturing process of the OLED panel.

The process is continuously discussed with reference to FIG. 19, FIG. 21, and the flowchart in FIG. 10. FIG. 21 is a drawing illustrating the display device 10 after completion of the step S507 in the flowchart illustrated in FIG. 10 as seen from the front side. FIG. 21 illustrates the same parts as FIG. 5.

The manufacturing apparatus produces the cathode electrode 19 by vapor deposition (step S507). The manufacturing apparatus produces the cap layer 48 by vapor deposition, for example. Since the cathode electrode 19 and the cap layer 48 are layers that cover the entire surface of the display unit 15, they need not be produced with high precision.

From the above-described processes, the TFT substrate 16 having the driving circuit 20 and the display unit 15 on one surface of the first substrate 11 is finished.

Figure 22:
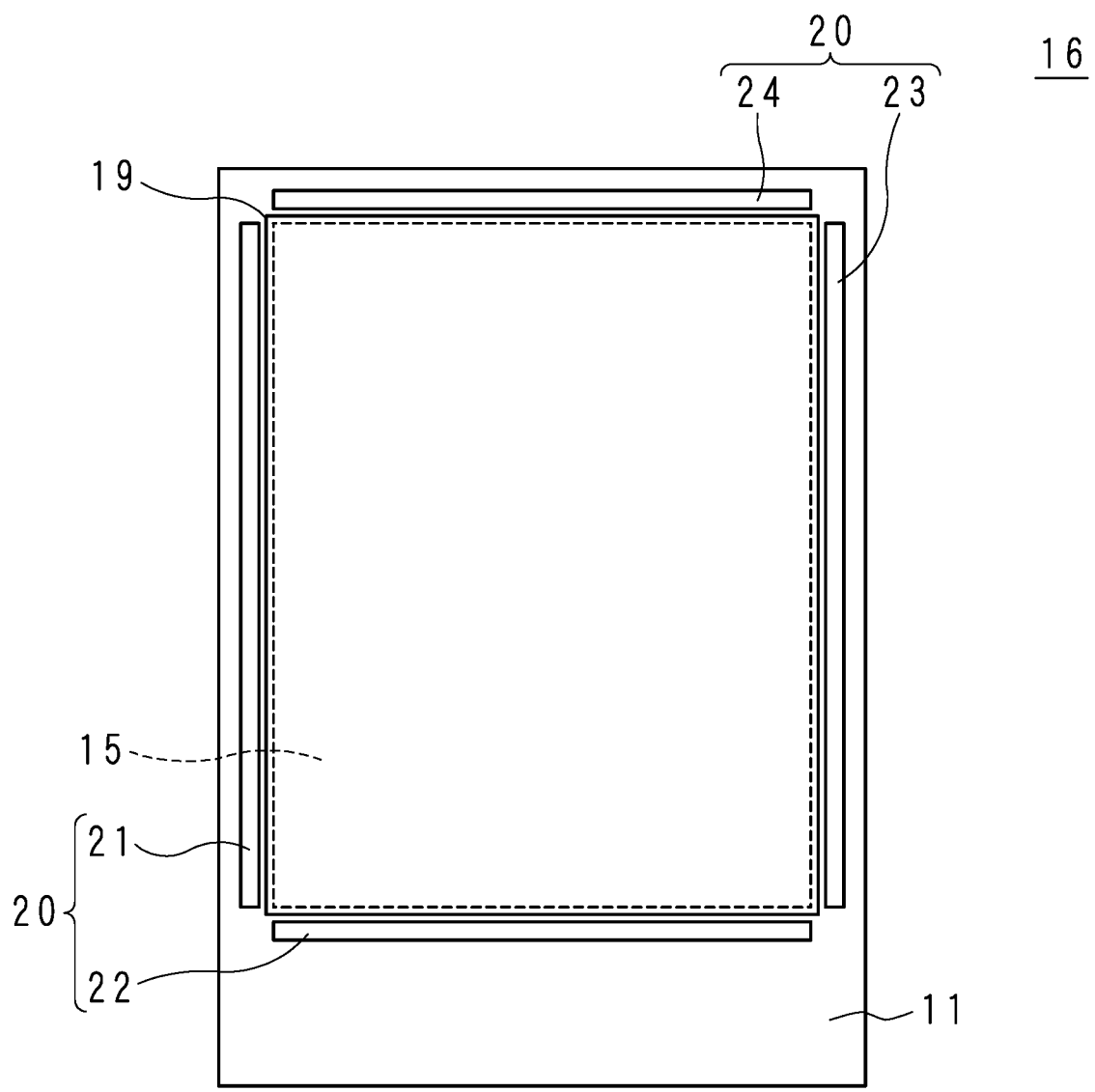
FIG. 22 illustrates a manufacturing process of the OLED panel.
Figure 23:
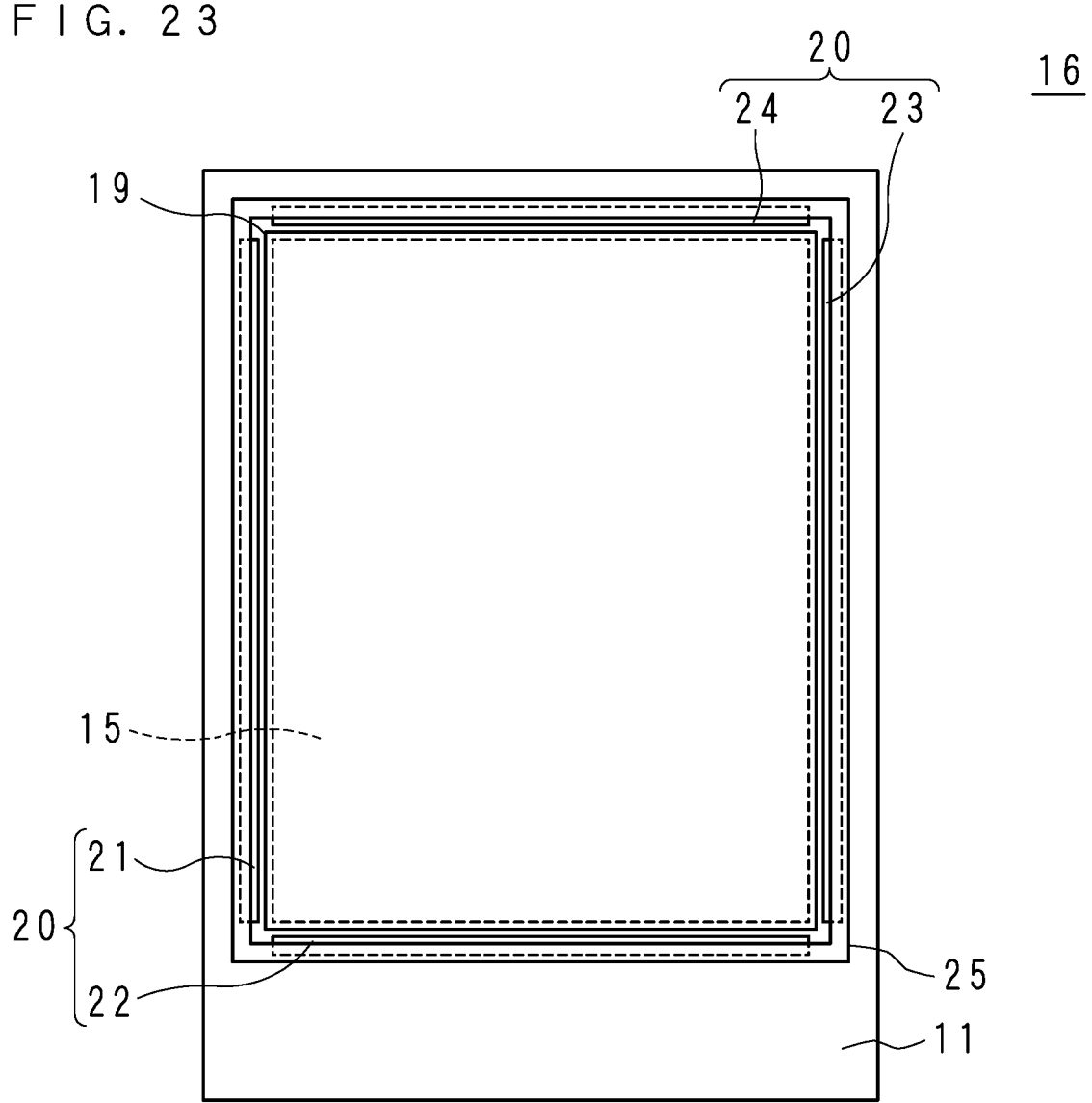
FIG. 23 illustrates a manufacturing process of the OLED panel.

With reference to FIG. 22 and FIG. 23, the step S508 in the flowchart illustrated in FIG. 10 will be discussed below. FIG. 22 is a drawing of the TFT substrate 16 as seen from the front side before start of the step S508. FIG. 23 is a drawing of the TFT substrate 16 as seen from the front side after completion of the step S508.

With reference to FIG. 22, the first substrate 11 before start of the step S508 will be discussed. The cathode electrode 19 is placed on the rectangular display unit 15. In the surroundings of the display unit 15, the scan driver 21, the demultiplexer 22, the emission control driver 23 and the protection circuit 24 are disposed. It is noted that the first wiring unit 341, the second wiring unit 332 or the like for supplying voltage to the display unit 15, the scan driver 21, the demultiplexer 22, the emission control driver 23 and the protection circuit 24 are not illustrated.

The manufacturing apparatus prints the sealant 25 in the surrounding of the display unit 15 (step S508). The sealant 25 to be printed is a paste predominantly composed of low-melting-point powdered glass, that is, glass frit, for example. With reference to FIG. 23, the position where the manufacturing apparatus prints the sealant 25 will be discussed below. The manufacturing apparatus prints the sealant 25 such that the sealant 25 surrounds the display unit 15 over the scan driver 21, the demultiplexer 22, the emission control driver 23 and the protection circuit 24. That is, the manufacturing apparatus disposes the sealant 25 at the place where the pixel circuit, the OLED 97, the first wiring unit 341 and the second wiring unit 332 are surrounded thereby. The sealant 25 is thus disposed at least over the driving circuit 20 (upper side in the cross-sectional view).

The manufacturing apparatus disposes the second substrate 12 on the TFT substrate 16 (step S509). The second substrate 12 is placed over the display unit 15, the cathode electrode 19 and the sealant 25. It is noted that the second substrate 12 also covers the first wiring unit 341, the second wiring unit 332 and the like that are not illustrated in FIG. 22 and FIG. 23.

With reference to the flowcharts illustrated in FIG. 4 and FIG. 10, the process will continuously be discussed below. As described above, FIG. 4 is a schematic cross-sectional view illustrating the left part of the display device 10.

The manufacturing apparatus melts the sealant 25 by irradiating it with a laser beam through the second substrate 12. The melted sealant 25 is hardened to thereby seal the space 27 between the TFT substrate 16 and the second substrate 12, that is, the space 27 between the first substrate 11 and the second substrate 12 (step S510).

In the step S508, the region on which the sealant 25 is to be printed is illustrated by the printed region G in FIG. 4. The manufacturing apparatus irradiates the sealant 25 with the laser beam through the second substrate 12.

The sealant 25 melted by the irradiation of the laser beam spreads between the first substrate 11 and the second substrate 12 before hardening. Thus, the diffusion margin J is reserved on the right side of the laser irradiated region L. This makes it possible to prevent the melted hot sealant 25 from producing an adverse effect on the low-melting-point wiring layer 34 of the first power supply region D.

Similarly, the diffusion margin J is reserved on the left side of the laser irradiated region L. This makes it possible to prevent the melted hot sealant 25 flowing out through the first substrate 11 and the second substrate 12. It is noted that a part of the diffusion margin J near the periphery of the first substrate 11 into which the sealant 25 does not actually flow is the margin region B explained with reference to FIG. 3.

It is noted that the sealing process is performed within dry gaseous atmosphere, such as dry air or nitrogen gas. This makes it possible to seal the dry gas within the space 27 formed by the first substrate 11, the second substrate 12 and the sealant 25.

Then, the manufacturing apparatus pastes the quarter-wavelength retarder 28 and the polarizing plate 29 to the second substrate 12. From the above-described processes, the OLED panel is finished.

FIG. 24 is a configurational view of the hardware of the display device 10. The display device 10 has the FPC 14, the driver IC 13 and the TFT substrate 16. The TFT substrate 16 has the driving circuit 20 including the scan driver 21, the demultiplexer 22 and the emission control driver 23 or the like and the display unit 15.

The driver IC 13 processes an image signal obtained through the FPC 14, and outputs the image signal to the driving circuit 20 of the TFT substrate 16. The driving circuit 20 controls the display unit 15.

Figure 25:
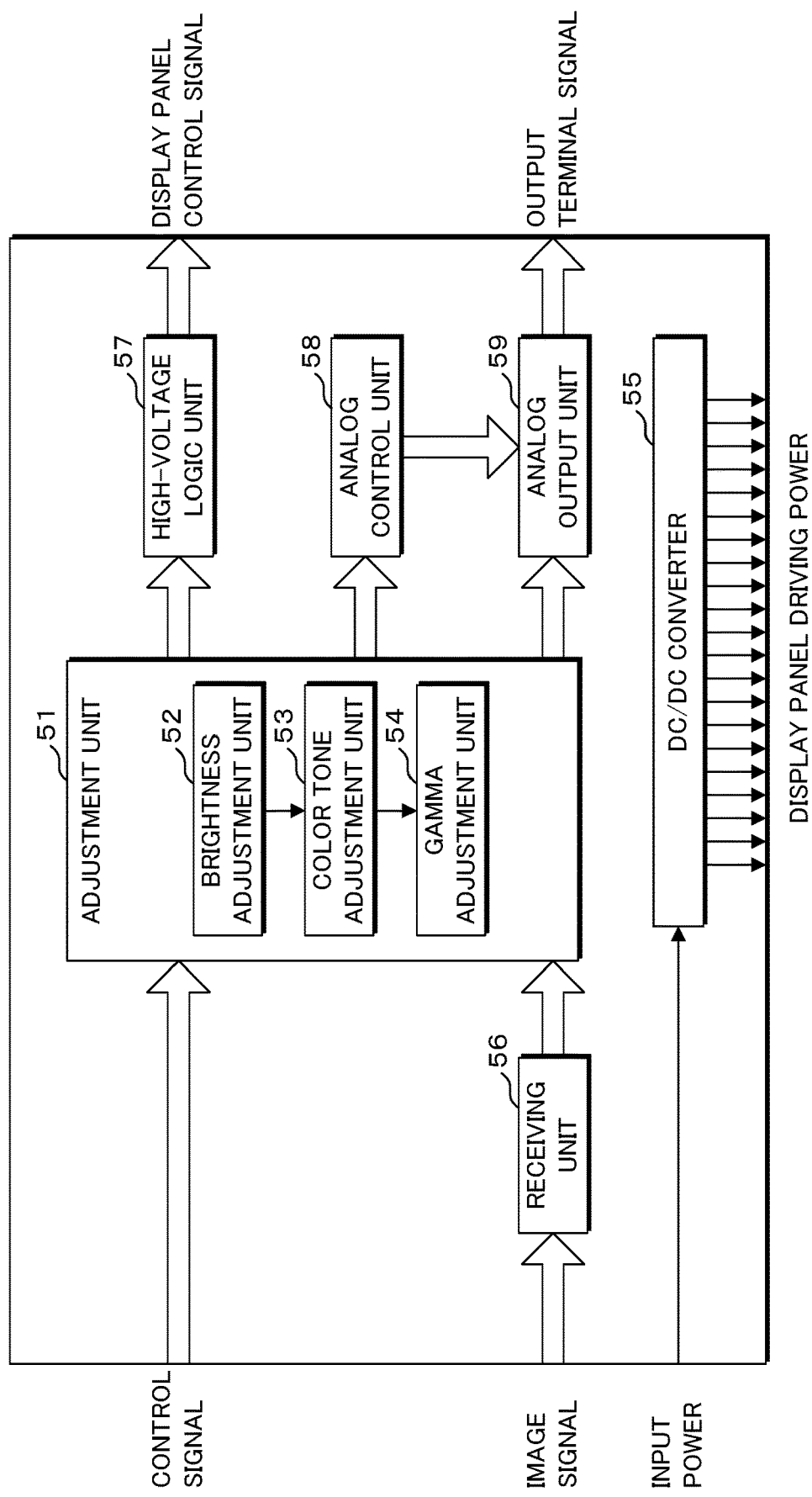
FIG. 25 is a configurational view of a driver IC.

FIG. 25 is a configurational view of the driver IC 13. With reference to FIG. 25, the function of the driver IC 13 will be discussed. The driver IC 13 includes an adjustment unit 51, a reception unit 56, a high voltage logic unit 57, an analog control unit 58, an analog output unit 59 and a DC/DC converter 5. The adjustment unit 51 is a low-voltage logic circuit that can operate at high speeds. The adjustment unit 51 includes a brightness adjustment unit 52, a color control unit 53 and a gamma adjustment unit 54. The brightness adjustment unit 52, the color control unit 53 and the gamma adjustment unit 54 are embodied by a brightness adjustment circuit, a color adjustment circuit and a gamma adjustment circuit, respectively.

The adjustment unit 51 may be a processor mounted on the driver IC 13. In this case, the adjustment unit 51 reads a control program from a nonvolatile memory (not illustrated) that is contained in the driver IC 13, and develops the read program on the DRAM or the like (not illustrated) that is mounted on the driver IC 13, for example. From the above, the brightness adjustment unit 52, the color control unit 53 and the gamma adjustment unit 54 can be embodied.

A control signal, an image signal and input power are supplied to the driver IC 13 via the FPC 14. The image signal is a signal adhering to the standards determined by Mobile Industry Processor Interface (MIPI) or MIPI Alliance, for example.

The reception unit 56 receives an image signal and outputs the signal to the adjustment unit 51. The brightness adjustment unit 52, the color control unit 53 and the gamma adjustment unit 54 in series process the video signal based on the control signal so as to make the signal conform to the characteristics of the display device 10.

The high voltage logic unit 57 generates a display panel control signal based on the video signal processed by the adjustment unit 51. The display panel control signal is a high-voltage digital signal. The high voltage logic unit 57 outputs the display panel control signal to the emission control driver 23 and the scan driver 21 within the driving circuit 20 via the wirings on the TFT substrate 16. The signals sent to the emission control driver 23 and the scan driver 21 serve as input signals for both of the drivers.

The analog control unit 58 and the analog output unit 59 in turn perform a process on the video signal which has processed by the adjustment unit 51 and output an output terminal signal. The output terminal signal is an analog signal. The analog output unit 59 outputs the output terminal signal to the display unit 15 via the demultiplexer 22. The output terminal signal serves as an analog input signal for the display unit 15.

The DC/DC converter 55 produces the display panel driving power based on the video signal processed by the adjustment unit 51 and the input power, and supplies the power to the respective circuits on the TFT substrate 16. The respective circuits are operated by the supplied display panel driving power.

The emission control driver 23 and the scan driver 21 control the luminance of each OLED 97 (see FIG. 26). The display unit 15 displays images according to the control.

An example of a circuit for making the OLEDs 97 emit light will be discussed below. FIG. 26 is a circuit diagram for making a single OLED 97 emit light. In FIG. 26, the single OLED 97 is illustrated by using a schematic symbol representing an organic light emitting diode (OLED). Hereinafter, the circuit illustrated in FIG. 26 is referred to as a pixel circuit.

The pixel circuit is connected with a positive power supply line PVDD, a negative power supply line PVEE, a video signal line Vdata and a scanning signal line Scan. The video signal line Vdata is connected to the demultiplexer 22. The scanning signal line Scan is connected to the scan driver 21.

The pixel circuit includes the OLED 97, a switch TFT 96, a driving TFT 98 and a retention capacitor 99. The video signal line Vdata is connected to the source electrode of the switch TFT 96. The scanning signal line Scan is connected to the gate electrode of the switch TFT 96. The positive power supply line PVDD is connected to one of the electrodes of the retention capacitor 99 and the source electrode of the driving TFT 98. The negative power supply line PVEE is connected to the cathode electrode 19 of the OLED 97. The drain electrode of the switch TFT 96 is connected to the other electrode of the retention capacitor 99 and the gate electrode of the driving TFT 98. The drain electrode of the driving TFT 98 is connected to the anode electrode 18 of the OLED 97 via the contact portion 38.

Figure 27:
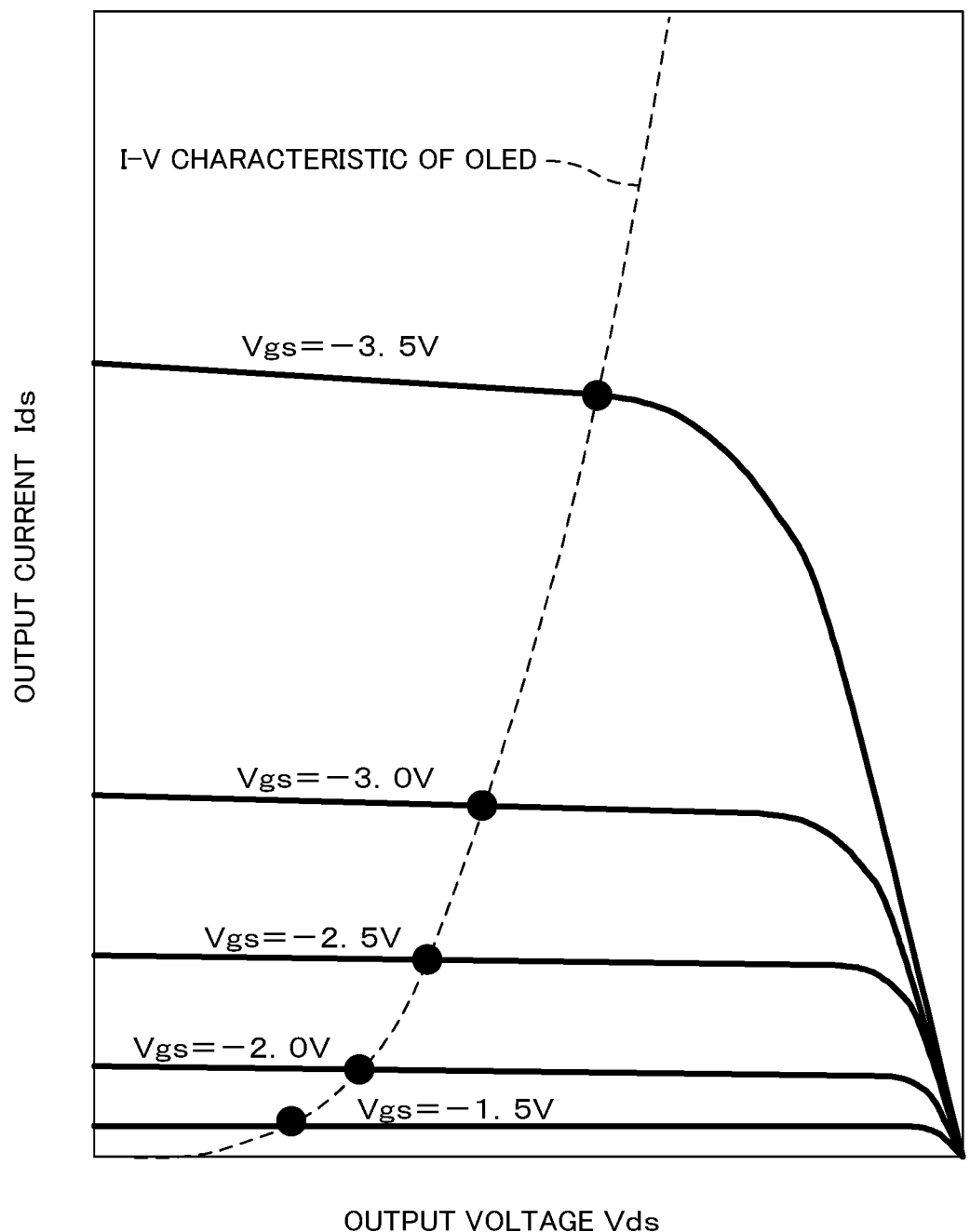
FIG. 27 illustrates output characteristics of a driving TFT.

FIG. 27 illustrates output characteristics of the driving TFT 98. With reference to FIG. 26 and FIG. 27, the operation of the pixel circuit will be discussed below.

The horizontal axis in FIG. 27 indicates the output voltage Vds of the driving TFT 98. The vertical axis in FIG. 27 indicates the output current Ids of the driving TFT 98. The solid lines in FIG. 27 represent the relationship between the output voltage Vds and the output current Ids of the driving TFT 98 in the case that a potential difference Vgs between the gate electrode and the source electrode of the driving TFT 98 is −1.5V, −2.0V, −2.5V, −3.0V and −3.5V. The dashed line in FIG. 27 represents I-V characteristics being a current-voltage relationship between the anode electrode 18 and the cathode electrode 19 of the OLED 97.

Figure 28:
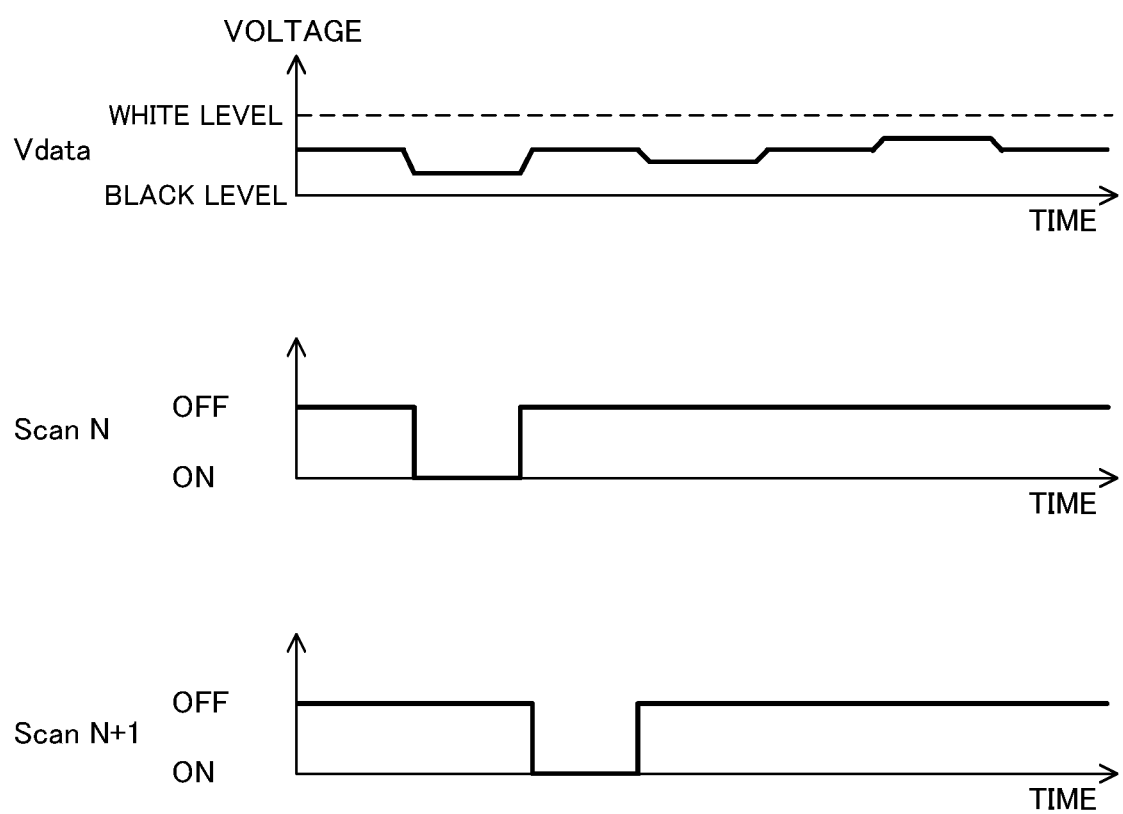
FIG. 28 is a timing diagram illustrating a video signal and a driving signal.

FIG. 28 a timing diagram illustrating a video signal and a driving signal. The horizontal axis in FIG. 28 indicates time. The vertical axis in FIG. 28 indicates voltages of a video signal Vdata, a scanning signal ScanN in the N-th scanning line and a scanning signal ScanN+1 in the N+1-th scanning line. The video signal Vdata is voltage levels ranging from black to white corresponding to brightness of the respective OLEDs 97. The scanning signal ScanN and the scanning signal Scan each have an ON level or an OFF level. In FIG. 28, the scanning signal Scan is turned on for low voltage, and turned off for high voltage.

With reference to FIG. 26 to FIG. 28, the operation of the OLED 97 will be discussed. Voltage is applied to each pixel circuit from the scanning signal line Scan and the video signal line Vdata. In the case that a scanning line is selected by the scan driver 21, that is, the scanning signal line Scan is turned on, the switch TFT 96 is turned on, and voltage corresponding to the voltage input from the video signal line Vdata is output from the drain electrode of the switch TFT 96.

The driving TFT 98 performs the operation illustrated in FIG. 27 in accordance with the potential difference Vgs between the output voltage of the drain electrode of the switch TFT 96 and the positive power supply line PVDD. That is, as the potential difference Vgs is low in voltage, more current flows through the OLED 97. As a result, the OLED 97 emits light with high luminance. After the input from the scanning signal line Scan is turned off, the charges stored in the retention capacitor 99 maintains the potential difference Vgs in the driving TFT 98, which allows the OLED 97 to continuously emit light.

It is noted that the pixel circuit in FIG. 26 is one example. The pixel circuit may be configured such that more TFTs and capacitors are combined.

The shapes of the semiconductor portion 31, the gate portion 32, the source-drain portion 33, and the low-melting-point wiring layer 34 that are described above are mere examples, and are schematic drawings simplified for the sake of explanation. Furthermore, the manufacturing process and the manufacturing apparatus used in each process are mere examples.

It is noted that the structure, the operation and the manufacturing method of the display device 10 are discussed above, exemplifying a case that a top emission OLED panel that emits light toward the surface on the second substrate 12 is employed for the display device 10. A bottom emission OLED panel that emits light toward the first substrate 11 may be employed for the display device 10.

Embodiment 2

The present embodiment relates to a display device 10 having a third refractory metal layer 35 interposed between the gate portion 32 and the source-drain portion 33.

Figure 29:
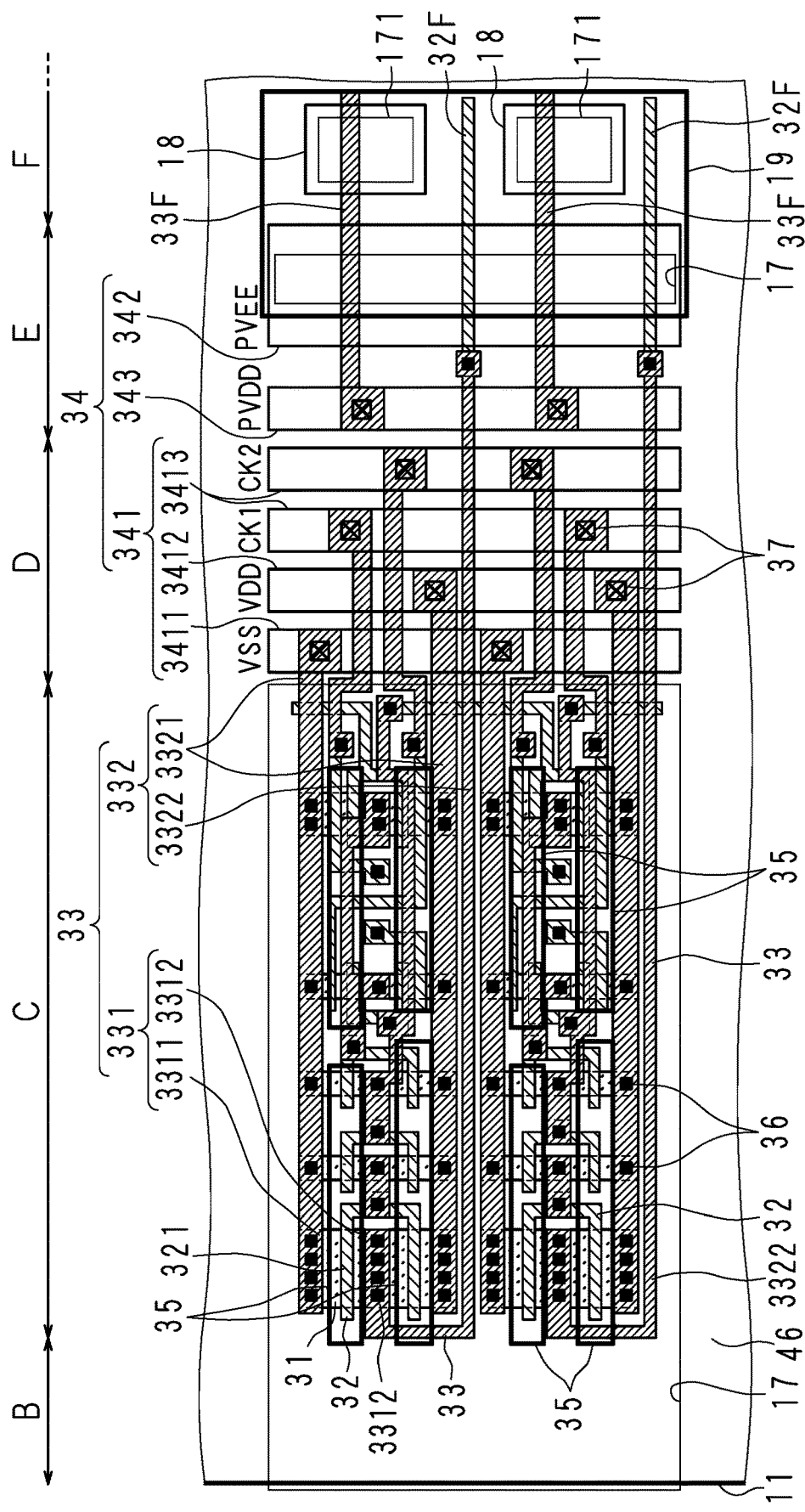
FIG. 29 is a schematic plan view of a display device according to Embodiment 2.

FIG. 29 is a schematic plan view illustrating the display device 10 according to Embodiment 2. FIG. 29 is a drawing illustrating the semiconductors and wirings at the left end of the display device 10 in an enlarged scale. FIG. 29 illustrates the same parts as FIG. 5. The description of the parts equivalent to Embodiment 1 will not be repeated.

The following provides a brief overview of the disposition of semiconductors and wirings of this embodiment. The difference between the present embodiment and Embodiment 1 is the third refractory metal layer 35 provided in the seal region C. It is noted that the third refractory metal layer 35 is also provided in the display region F, but is not illustrated in FIG. 29.

The source-drain portion 33 overlaps parts of the third refractory metal layer 35. However, a part of the third refractory metal layer 35 that is covered by the source-drain portion 33 is also represented by a bold solid line in FIG. 29 in order to make the shape and the disposition of the third refractory metal layer 35 easy to understand.

The third refractory metal layer 35 is a horizontally elongated rectangle. The third refractory metal layer 35 is disposed on a channel region of the transistors of the driving circuit 20. It is noted that the third refractory metal layer 35 is not disposed at a part where the first contact hole 36 is present.

Figure 30:
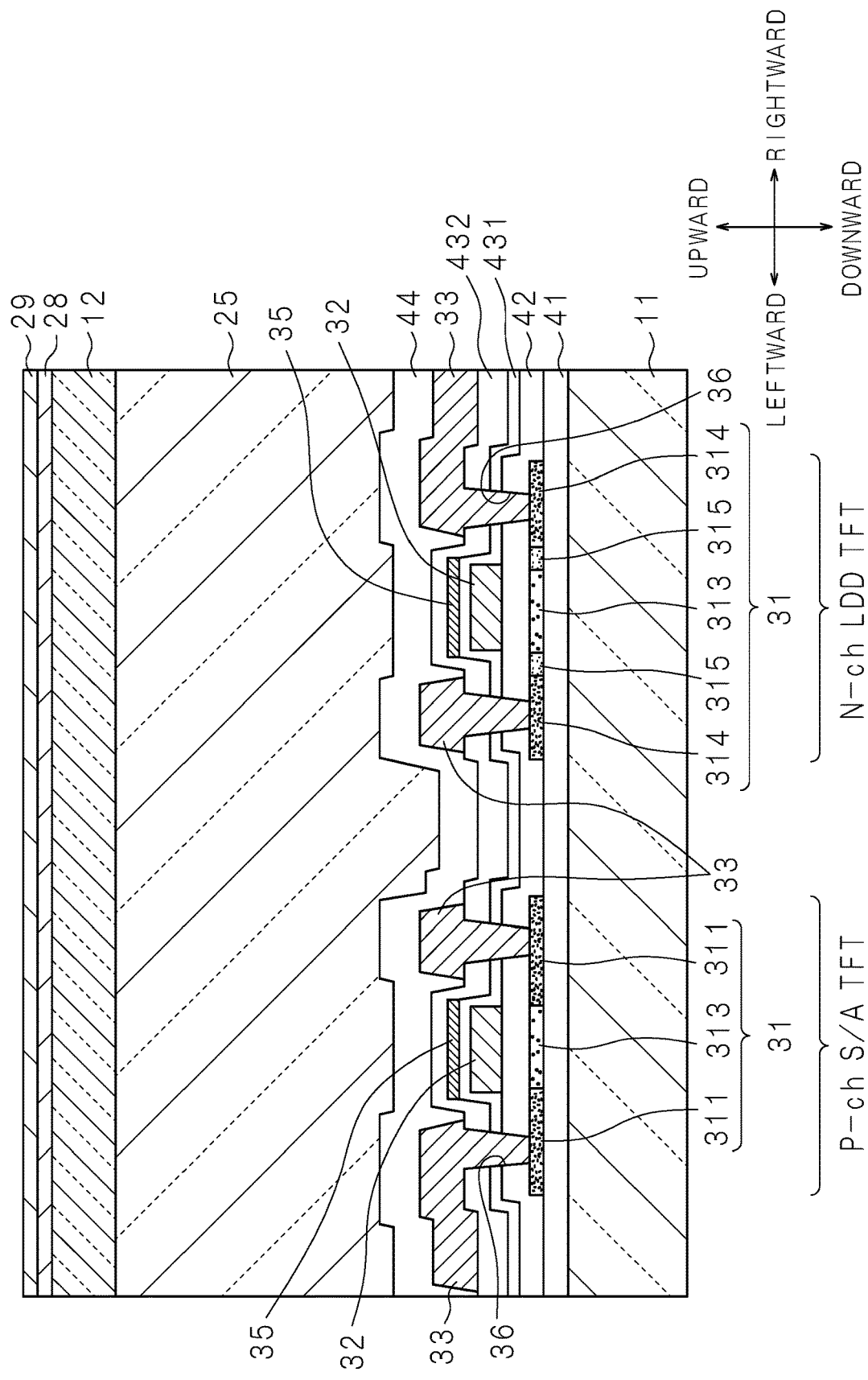
FIG. 30 is a schematic cross-sectional view of a seal region according to Embodiment 2.

FIG. 30 is a schematic cross-sectional view of the seal region C according to Embodiment 2. Similarly to FIG. 3 and FIG. 6, FIG. 30 schematically illustrates a part of the seal region C including two transistors out of a number of transistors disposed in the seal region C. With reference to FIG. 30, the structure of the seal region C will be discussed.

The third refractory metal layer 35 is disposed between the first interlayer insulating layer 431 and the second interlayer insulating layer 432. The third refractory metal layer 35 covers the channel region of the transistor constituting the driving circuit 20.

The first interlayer insulating layer 431 and the second interlayer insulating layer 432 each have a constant thickness, and are formed to conform to the irregularities of the layers below them.

The first interlayer insulating layer 431 and the second interlayer insulating layer 432 are made of inorganic materials. It is noted that the first interlayer insulating layer 431 and the second interlayer insulating layer 432 may be made either of the same material or different materials. The third refractory metal layer 35 is made of a refractory metal.

Figure 31:
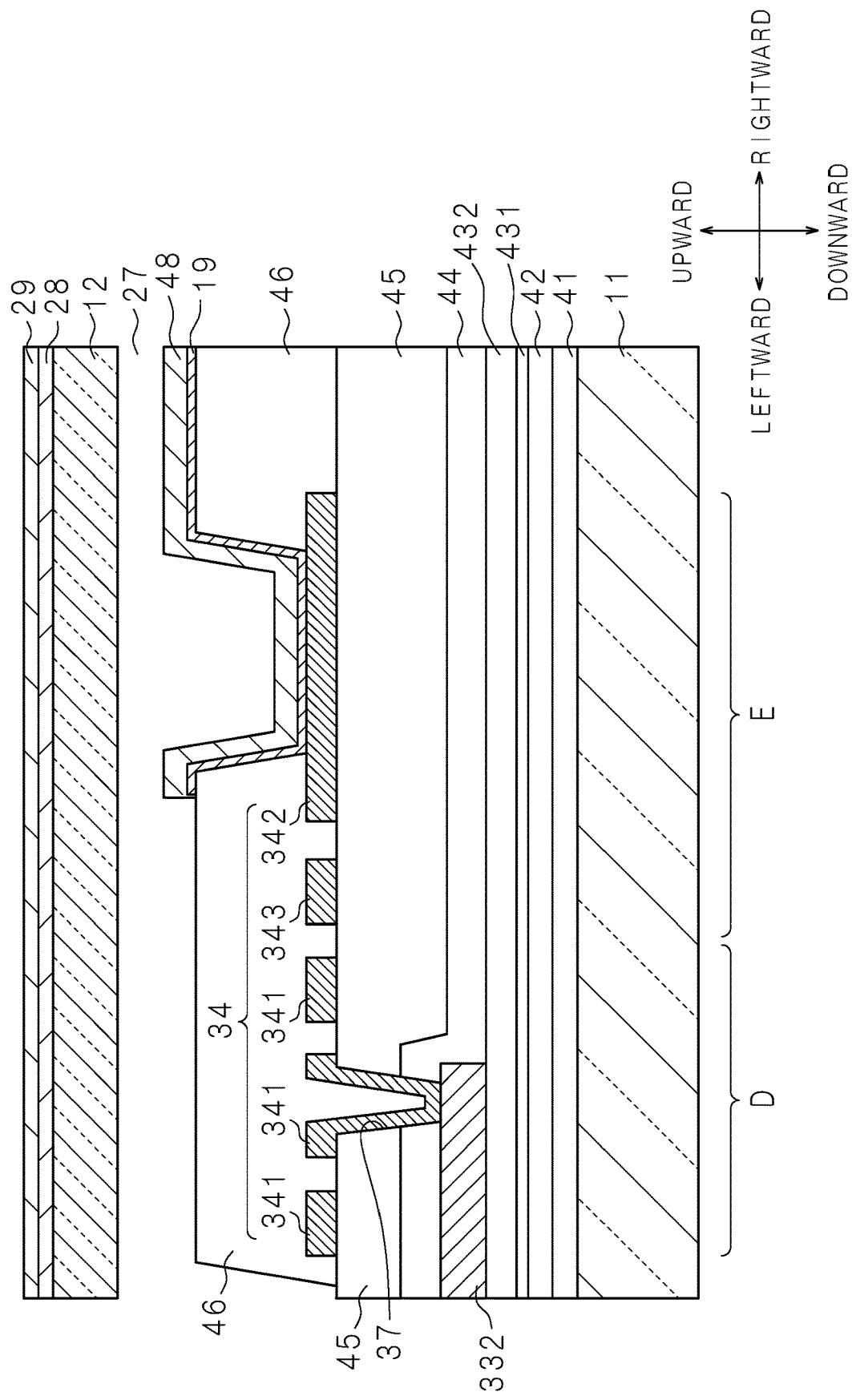
FIG. 31 is a schematic cross-sectional view of a first power supply region and a second power supply region according to Embodiment 2.

FIG. 31 is a schematic cross-sectional view of the first power supply region D and the second power supply region E according to Embodiment 2. With reference to FIG. 31, the structure of the first power supply region D and the second power supply region E will be discussed below. It is noted that the description of the parts equivalent to the seal region C discussed with reference to FIG. 30 will not be repeated. In FIG. 31, the first interlayer insulating layer 431 and the second interlayer insulating layer 432 are disposed as interlayer insulating layers.

Figure 32:
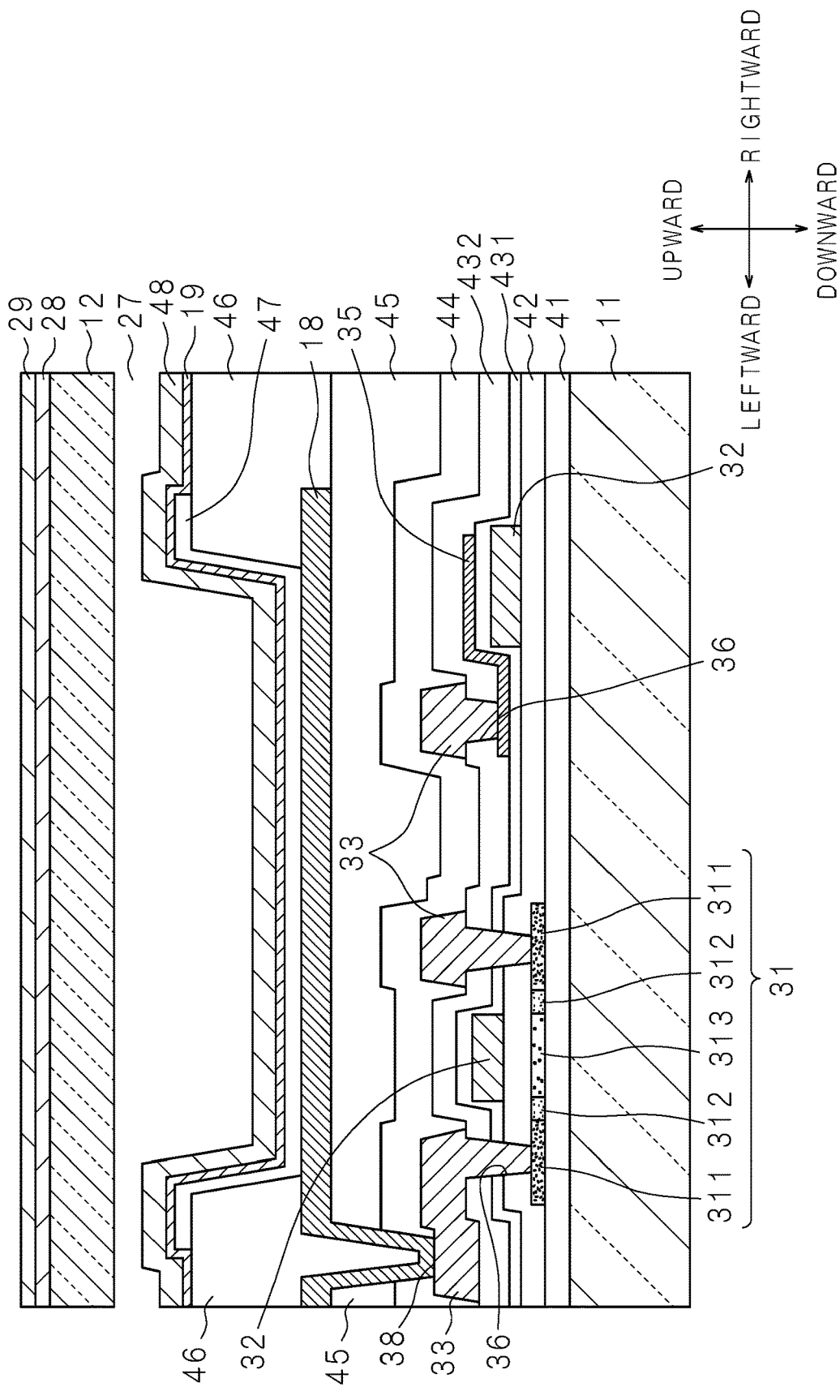
FIG. 32 is a schematic cross-sectional view of a display region according to Embodiment 2.

FIG. 32 is a schematic cross-sectional view of the display region F according to Embodiment 2. With reference to FIG. 32, the structure of the display region F will be discussed. It is noted that the description of the parts equivalent to the seal region C discussed with reference to FIG. 30 will not be repeated. Also, it is noted that the description of the parts equivalent to first power supply region D and the second power supply region E discussed with reference to FIG. 31 will not be repeated.

In the display apparatus 10 according to this embodiment, the first interlayer insulating layer 431, the third refractory metal layer 35, and the second interlayer insulating layer 432 are disposed (layered) in this order in place of the interlayer insulating layer 43 illustrated in FIG. 8 in Embodiment 1.

The gate portion 32, the first interlayer insulating layer 431 and the third refractory metal layer 35 at the right in FIG. 32 are formed of a retention capacitor. The source-drain portion 33 is connected to the third refractory metal layer 35 via the first contact hole 36.

The semiconductor portion 31 may also be provided between the base insulating layer 41 and the gate insulating layer 42 at the right in FIG. 32 although it is not presented in the cross section. In the case that the semiconductor portion 31 is provided without the right-hand gate portion 32 being provided, the semiconductor portion 31, the gate insulating layer 42, the first interlayer insulating layer 431 and the third refractory metal layer 35 constitute a retention capacitor. In the case that both of the right-hand gate portion 32 and the third refractory metal layer 35 are provided, two retention capacitors that are connected in series can be formed.

Figure 33:
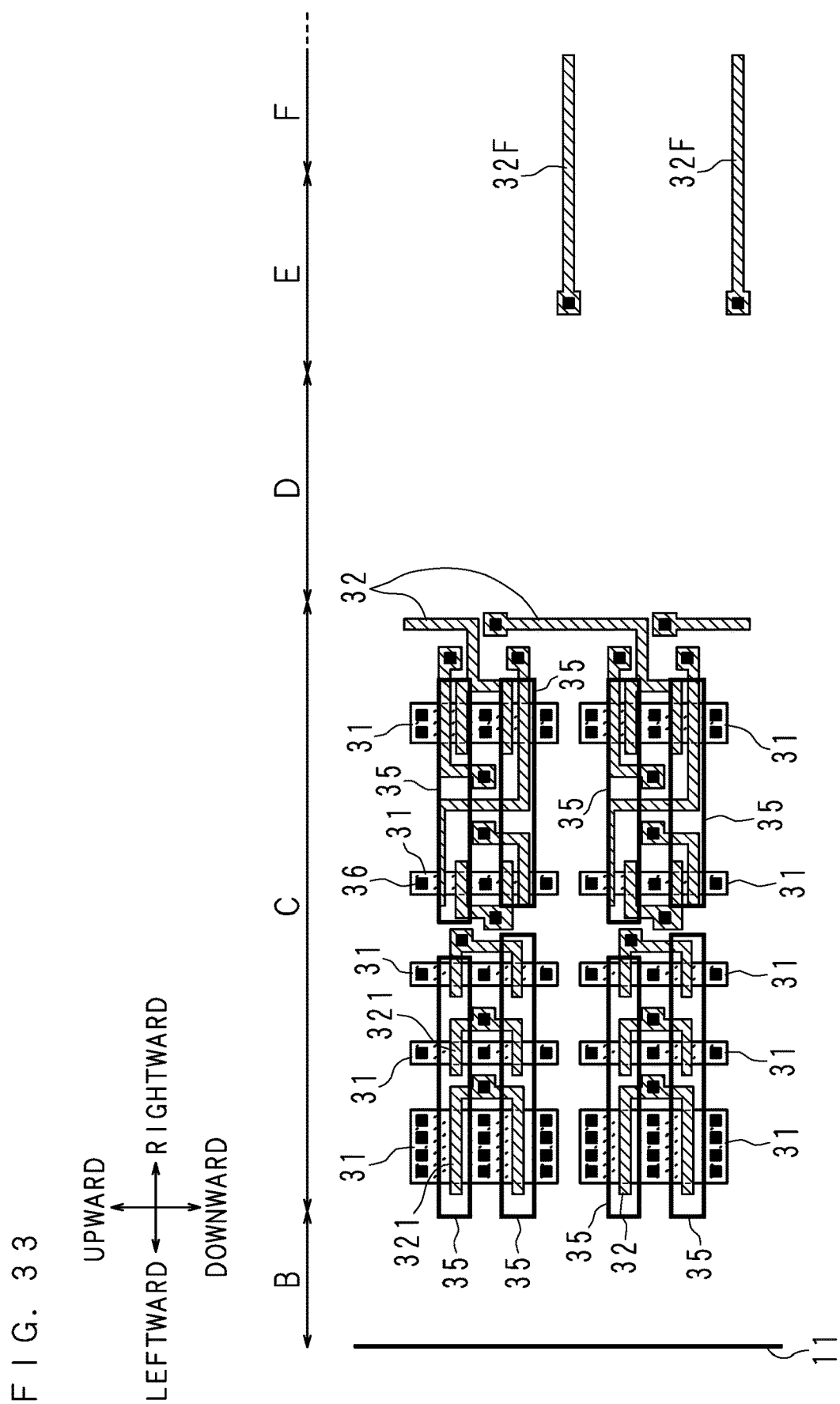
FIG. 33 illustrates a manufacturing process of an OLED panel according to Embodiment 2.

FIG. 33 illustrates a manufacturing process of an OLED panel according to Embodiment 2. The OLED panel according to this embodiment is manufactured in the same processes as those of Embodiment 1 up to the process described with reference to FIG. 13 and FIG. 14, that is, the process of producing the gate portion 32.

After forming the gate portion 32, the manufacturing apparatus deposits a silicon oxide film, for example, by a CVD method or the like to form the first interlayer insulating layer 431. The manufacturing apparatus laminates the third refractory metal layer 35 in a predetermined form by a spattering method or the like. As its name implies, the third refractory metal layer 35 is made of refractory metal materials. The manufacturing apparatus deposits, for example, a silicon oxide film or the like by a CVD method or the like to form the second interlayer insulating layer 432.

Figure 34:
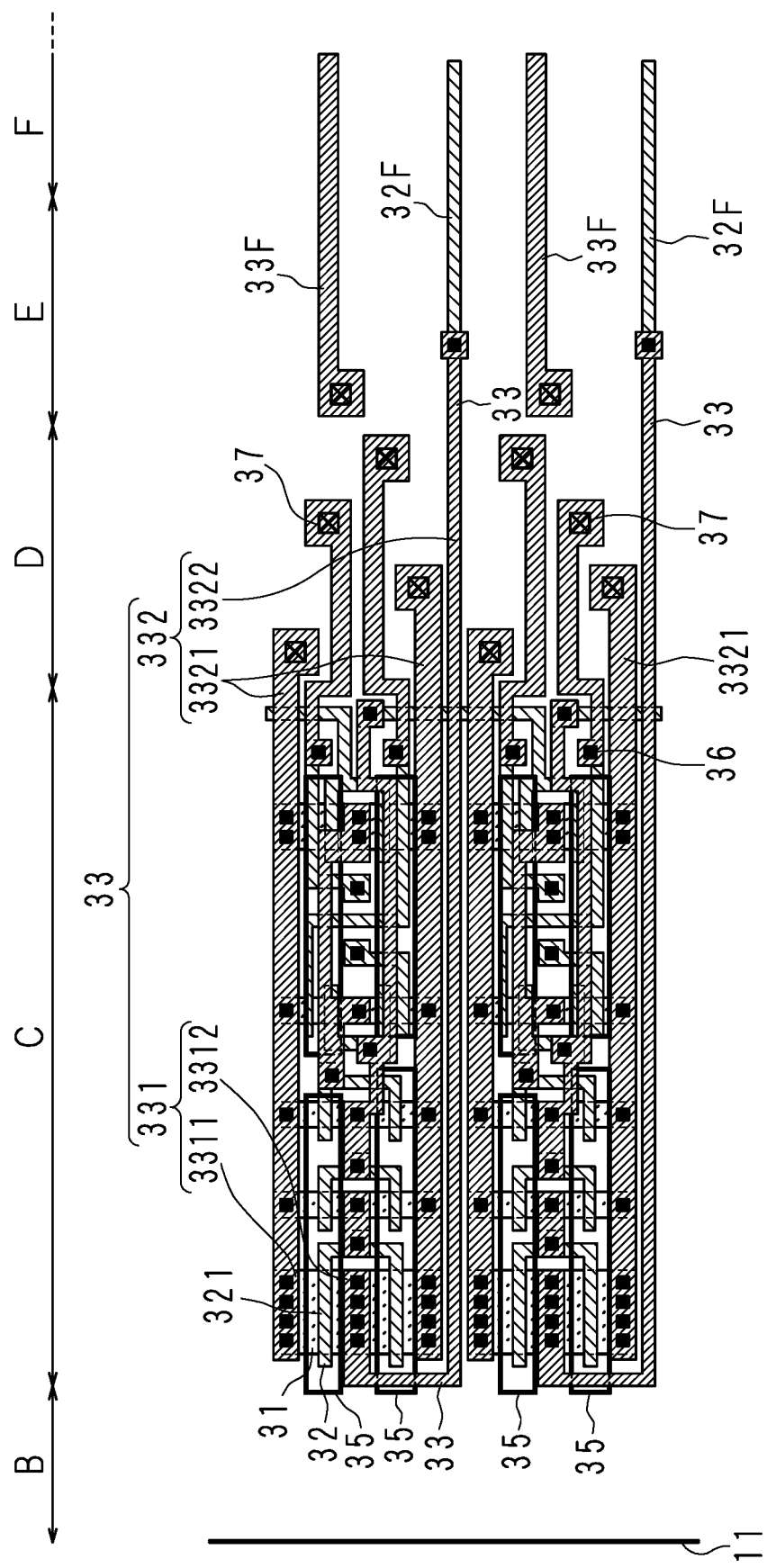
FIG. 34 illustrates a manufacturing process of the OLED panel according to Embodiment 2.

FIG. 34 illustrates a manufacturing process of an OLED panel according to Embodiment 2. The manufacturing apparatus performs anisotropic etching on the first interlayer insulating layer 431, the second interlayer insulating layer 432 and the gate insulating layer 42 to produce a hole penetrating to the semiconductor portion 31 or the third refractory metal layer 35. The manufacturing apparatus laminates the source-drain portion 33 in a predetermined form by a spattering method or the like. Since the subsequent manufacturing process is the same as that of Embodiment 1, the description thereof will not be repeated.

As described above, the display device 10 is provided with a metal layer (third refractory metal layer 35, for example) that is made of materials having a higher melting point than the first metal and covers the semiconductor portion 31 of the transistor between the driving circuit 20 and the sealant 25.

According to the present embodiment, it is possible to avoid laser irradiation onto the channel region of the transistor constituting the driving circuit 20 in the process of melting the sealant 25 by the laser irradiation. Thus, deterioration of the semiconductors in the channel region can be prevented.

The third refractory metal layer 35 is preferably made of materials having a high reflectivity of a laser beam. This allows the third refractory metal layer 35 to reflect a laser beam toward the sealant 25, which speeds up melting of the sealant 25. Accordingly, the sealant 25 can be promptly and surely melted to thereby seal the space 27 between the first substrate 11 and the second substrate 12. As described above, the prompt melting of the sealant 25 can make the irradiation time of a laser beam to the transistor 26 shorter. Consequently, the degradation of the transistor 26 by the laser beam can be prevented.

Furthermore, the third refractory metal layer 35 can be also used for capacitors and wirings of the pixel circuit. Accordingly, complex pixel circuits can be produced with high density in the display region F.

Embodiment 3

The present embodiment relates to a display device 10 employing a p-channel metal oxide semiconductor (PMOS) transistor for the driving circuit 20. It is noted that the parts equivalent to Embodiment 1 will not be described here.

Figure 35:
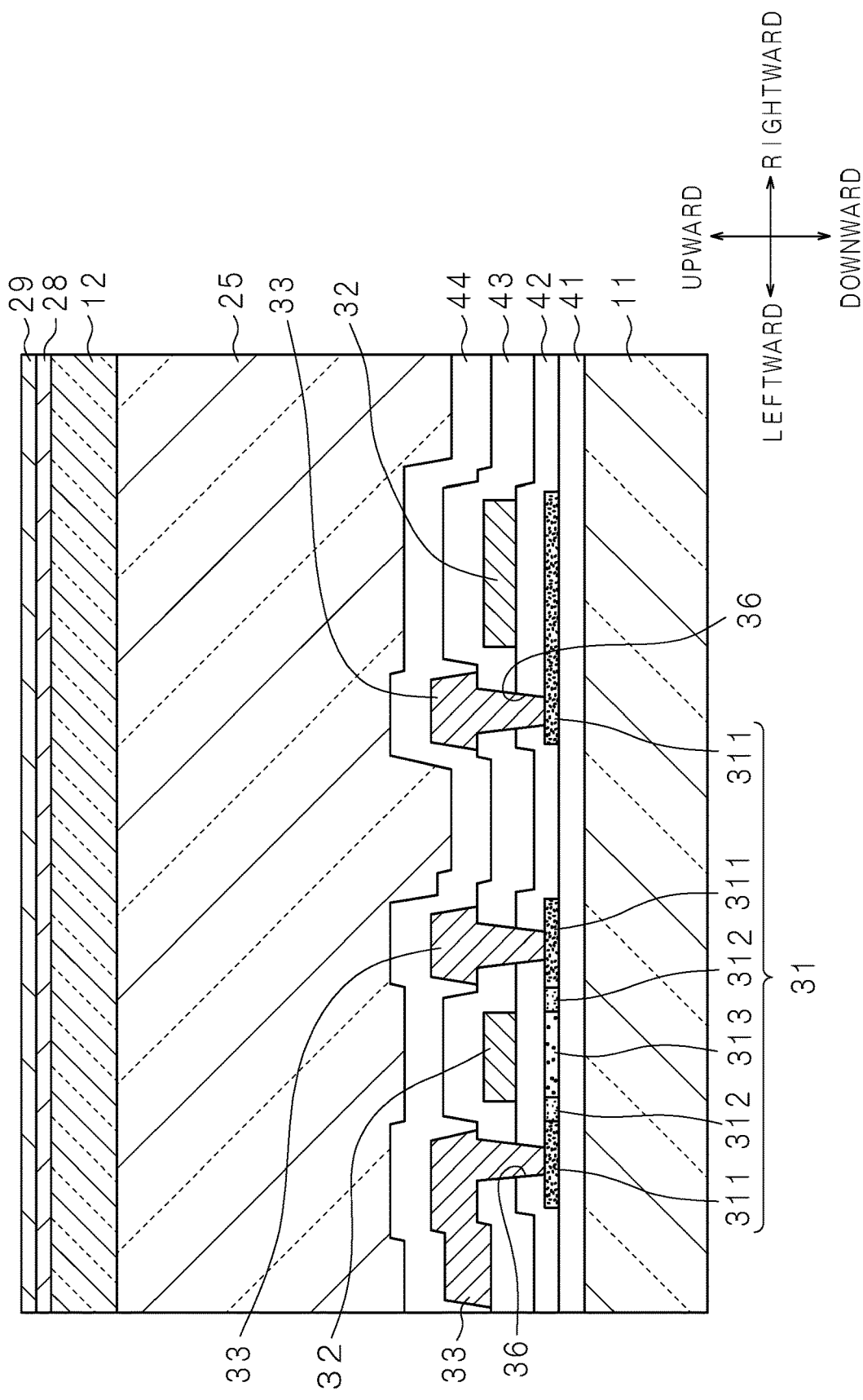
FIG. 35 is a schematic cross-sectional view of a seal region according to Embodiment 3.

FIG. 35 is a schematic cross-sectional view of the seal region C according to Embodiment 3. Similarly to FIG. 3 and FIG. 6, FIG. 35 schematically illustrates a part of the seal region C including two transistors out of a number of transistors disposed in the seal region C. With reference to FIG. 35, the structure of the seal region C will be discussed.

Since the transistor in FIG. 35 used for the driving circuit 20 is a PMOS transistor, an NMOS transistor is not included unlike FIG. 6. In place of the NMOS transistor in FIG. 6, the semiconductor portion 31, the gate insulating layer 42 and the gate portion 32 at the right in FIG. 35 constitute a retention capacitor.

The semiconductor portion 31 includes the p-type heavily doped layer 311, the p-type lightly doped layer 312, and the undoped layer 313. It is noted that the semiconductor portion 31, the gate portion 32 and the source-drain portion 33 at the left in FIG. 35 constitute a TFT.

Although not presented in the cross-section in FIG. 35, the source-drain portion 33 may be connected the second wiring unit 332 extending toward the first power supply region D similarly to Embodiment 1.

Embodiment 4

The present embodiment relates to a display device 10 that employs a PMOS type transistor for the driving circuit 20, and has the third refractory metal layer 35. It is noted that the parts equivalent to Embodiment 2 is not described.

Figure 36:
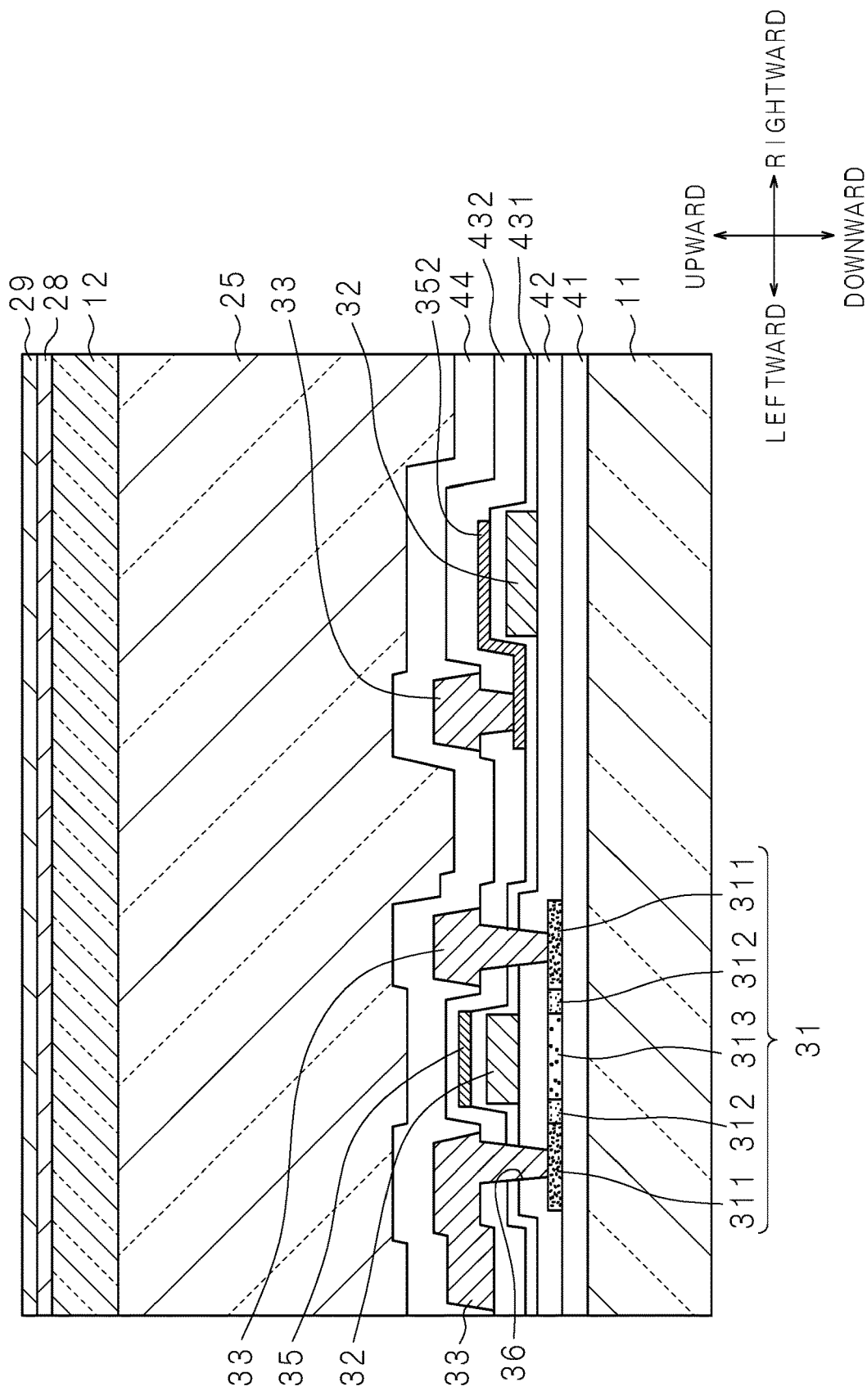
FIG. 36 is a schematic cross-sectional view of a seal region according to Embodiment 4.

FIG. 36 is a schematic cross-sectional view of the seal region C according to Embodiment 4. Similarly to FIG. 3 and FIG. 6, FIG. 36 schematically illustrates a part of the seal region C including two transistors out of a number of transistors disposed in the seal region C. With reference to FIG. 36, the structure of the seal region C will be discussed.

The transistors used for the driving circuit 20 according to this embodiment is a PMOS transistor similarly to FIG. 3. Since the structure of the transistor formed by the semiconductor portion 31 or the like is the same as that of Embodiment 3, the description thereof is not repeated.

At the right in FIG. 36, a retention capacitor is formed by the third electrode portion 352 being a part of the third refractory metal layer 35, the first interlayer insulating layer 431 and the gate portion 32.

At the right in FIG. 36, the semiconductor portion 31 may also be provided between the base insulating layer 41 and the gate insulating layer 42 although it is not presented in the cross section. In a case that the semiconductor portion 31 is provided without the right-hand gate portion 32 being provided, the semiconductor portion 31, the gate insulating layer 42, the first interlayer insulating layer 431 and the third electrode portion 352 constitute a retention capacitor. In the case that the right-hand gate portion 32, the third refractory metal layer 35 and the semiconductor portion 31 are provided, two retention capacitors that are connected in series can be formed.

In addition, technical characteristics (configuration requirements) described in each embodiment may be combined with each other, and new technical characteristics may be formed by combining the same.

It should be understood that the embodiments disclosed herein are illustrative and non-restrictive in every respect. Since the scope of the present invention is defined by the appended claims rather than by the description preceding them, and all changes that fall within metes and bounds of the claims, or equivalence of such metes and bounds thereof are therefore intended to be embraced by the claims.

What is claimed is:

1. A display device comprising:
a first substrate;
a second substrate facing the first substrate;
a sealant that seals the first substrate and the second substrate;
a display unit having a plurality of pixels each including an organic light emitting element that emits light based on current, a pixel circuit that controls current to be supplied to the organic light emitting elements, and a planarization layer being an interlayer insulating film for planarizing a top surface of the pixel circuit;
a driving circuit that includes a transistor for driving the pixel circuit;
a first wiring unit configured to supply voltage to the transistor; and
a second wiring unit configured to connect between an electrode portion included in the transistor and the first wiring unit,
wherein
in the display unit, the planarization layer is laminated on the pixel circuit and the organic light emitting elements are laminated on the planarization layer,
the driving circuit is disposed outside the display unit,
the first wiring unit is disposed between the display unit and the driving circuit,
a melting point of a second metal constituting the electrode portion and the second wiring unit is higher than a melting point of a first metal constituting the first wiring unit,
the first substrate, the driving circuit, the sealant, and the second substrate are laminated,
the sealant is made of glass frit bonding material to be melted by heating and hardened by cooling,
the planarization layer is not present between the sealant and the driving circuit,
a part of the sealant facing the driving circuit has an uneven shape and the uneven shape is formed by the electrode portion of the driving circuit,
the electrode portion included in the transistor comprises a gate electrode, a drain electrode, and a source electrode,
a convex part of the uneven shape, viewed from the first substrate side, is formed at an area where the gate electrode, the drain electrode, and the source electrode are present, and
a concave part of the uneven shape, viewed from the first substrate side is formed at an area where the gate electrode, the drain electrode, and the source electrode are absent.

2. The display device according to claim 1, wherein a melting point of the second metal constituting the gate electrode, the drain electrode and the source electrode is higher than a melting point of the first metal.

3. The display device according to claim 2, wherein the gate electrode, the drain electrode and the source electrode are made of a same metal.

4. The display device according to claim 2, wherein
the electrode portion included in the transistor and the second wiring unit are made of a same metal,
the second wiring unit has a second source wiring connected to a source electrode of the electrode portion,
the first wiring unit has a first source wiring connected to the second source wiring,
the second source wiring extends toward the first wiring unit, and
an end of the second source wiring on a first wiring unit side is connected to the first source wiring.

5. The display device according to claim 2, wherein
the electrode portion included in the transistor and the second wiring unit are made of a same metal,
the second wiring unit has a second drain wiring connected to a drain electrode of the electrode portion,
the first wiring unit has a first drain wiring connected to the second drain wiring,
the second drain wiring extends toward the first wiring unit, and
an end of the second drain wiring on a first wiring unit side is connected to the first drain wiring.

6. The display device according to claim 1, wherein
the driving circuit and the sealant which is hardened overlap.

7. The display device according to claim 1, wherein
an inorganic insulator film is provided between the sealant and the driving circuit, and
the inorganic insulator film and the sealant which is hardened overlap.

8. The display device according to claim 7, wherein
a part where the inorganic insulator film and the hardened sealant overlap has an uneven shape.

9. The display device according to claim 1, wherein a metal layer made of a material having a higher melting point than a melting point of the first metal that is placed over a semiconductor portion of the transistor is provided between the driving circuit and the sealant.

10. The display device according to claim 1, wherein
a first region of the driving circuit is disposed outside a second region of the display unit, and
a third region of the first wiring unit is disposed between the first region and the second region.

11. The display device according to claim 1, wherein the display unit, the driving circuit, the first wiring unit, the second wiring unit are disposed on the first substrate and are disposed under the second substrate.

12. The display device according to claim 1, wherein
the second metal does not include aluminum, and the first metal includes aluminum.

13. The display device according to claim 1, wherein
none of a gate electrode, a source electrode, or a drain electrode of the driving circuit disposed directly below the sealant include aluminum and both an anode electrode of the organic light emitting element and the first wiring unit include aluminum.

14. The display device according to claim 1, wherein
the first wiring unit and an anode electrode of the organic light emitting element are formed by a same layer.

* * * * *